(12) United States Patent
Adriani et al.

(10) Patent No.: US 8,697,981 B2
(45) Date of Patent: Apr. 15, 2014

(54) STRUCTURES FOR LOW COST, RELIABLE SOLAR MODULES

(75) Inventors: Paul M. Adriani, Palo Alto, CA (US); Martin R. Roscheisen, San Francisco, CA (US); Jeremy H. Scholz, Sunnyvale, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 1085 days.

(21) Appl. No.: 12/038,804

(22) Filed: Feb. 27, 2008

(65) Prior Publication Data
US 2008/0289682 A1     Nov. 27, 2008

Related U.S. Application Data

(60) Provisional application No. 60/891,914, filed on Feb. 27, 2007.

(51) Int. Cl.
*H01L 31/042* (2006.01)

(52) U.S. Cl.
USPC .................. 136/244; 136/246; 136/251

(58) Field of Classification Search
USPC .................. 438/66; 136/244, 246, 251
See application file for complete search history.

(56) References Cited

U.S. PATENT DOCUMENTS

| | | | | |
|---|---|---|---|---|
| 4,463,129 A | * | 7/1984 | Shinada et al. | 525/63 |
| 4,724,010 A | * | 2/1988 | Okaniwa et al. | 136/246 |
| 5,476,553 A | * | 12/1995 | Hanoka et al. | 136/251 |
| 5,578,142 A | * | 11/1996 | Hattori et al. | 136/251 |
| 5,986,203 A | * | 11/1999 | Hanoka et al. | 136/251 |
| 6,111,189 A | * | 8/2000 | Garvison et al. | 136/244 |
| 6,469,242 B1 | * | 10/2002 | Kondo | 136/251 |
| 6,586,271 B2 | * | 7/2003 | Hanoka | 438/66 |

FOREIGN PATENT DOCUMENTS

| | | | | |
|---|---|---|---|---|
| JP | 102316000 | * | 9/1998 | .......... H01L 31/042 |
| JP | 2002141543 | * | 5/2002 | |

OTHER PUBLICATIONS

JP102316000, Machine Translation, Iwasaki, Sep. 1998.*
JP2002-141543, Machine Translation, Shimizu, May 2002.*
Shimizu (JP 2002-141543), Human Translation, May 2002.*

* cited by examiner

*Primary Examiner* — Devina Pillay
(74) *Attorney, Agent, or Firm* — Joshua D. Isenberg; JDI Patent

(57) ABSTRACT

Methods and devices are provided for improved large-scale solar installations. In one embodiment, a photovoltaic module is provided comprising a module front layer comprising a glass plate, a module back layer comprising an electrically conductive foil, and a plurality of solar cells arranged to be protected by the front layer and the back layer. In some embodiments, the module back layer is aluminum foil. The module back layer may have an externally exposed surface. The module back layer may be electrically grounded. An electrically insulating pottant material may be used with the solar cells to separate them from the module back layer. This allows for a high voltage withstand between the cells and the outer surface of the back layer.

26 Claims, 22 Drawing Sheets

US 8,697,981 B2

STRUCTURES FOR LOW COST, RELIABLE SOLAR MODULES

CROSS REFERENCE TO RELATED APPLICATION

This application claims the benefit of priority to U.S. Provisional Application 60/891,914 filed Feb. 27, 2007 and fully incorporated herein by reference for all purposes.

FIELD OF THE INVENTION

This invention relates generally to photovoltaic devices, and more specifically, to improved solar cell module configurations and solar module power installations.

BACKGROUND OF THE INVENTION

Solar cells and solar cell modules convert sunlight into electricity. Traditional solar cell modules are typically comprised of polycrystalline and/or monocrystalline silicon solar cells mounted on a support with a rigid glass top layer to provide environmental and structural protection to the underlying silicon based cells. This package is then typically mounted in a rigid aluminum or metal frame that supports the glass and provides attachment points for securing the solar module to the installation site. A host of other materials are also included to make the solar module functional. This may include junction boxes, bypass diodes, sealants, and/or multi-contact connectors used to complete the module and allow for electrical connection to other solar modules and/or electrical devices. Certainly, the use of traditional silicon solar cells with conventional module packaging is a safe, conservative choice based on well understood technology.

Drawbacks associated with traditional solar module package designs, however, have limited the ability and financial rationale to install large numbers of solar panels in a cost-effective manner. Unfortunately, traditional solar modules come with a great deal of redundancy and excess equipment cost. For example, a recent installation of conventional solar modules in Pocking, Germany deployed 57,912 monocrystalline and polycrystalline-based solar modules. This meant that there were also 57,912 junction boxes, 57,912 aluminum frames, untold meters of cablings, and numerous other components. These traditional module configurations are also constrained by conventional design methodology that limit the modules to certain materials and inherit a large number of legacy parts. This combination of high material cost and conventional design hamper the ability of installers to rapidly and cost-efficiently deploy solar modules at a large scale.

Although subsidies and incentives have created some large solar-based electric power installations, the potential for greater numbers of these large solar-based electric power installations has not been fully realized. There remains substantial improvement that can be made photovoltaic modules that can greatly reduce their cost of manufacturing, increase their ease of installation, and create much greater market penetration and commercial adoption of such products, particularly for large scale installations.

SUMMARY OF THE INVENTION

Embodiments of the present invention address at least some of the drawbacks set forth above. The present invention provides for the improved solar module designs that simplifies solar module design and reduces the materials costs associated with such modules. Although not limited to following, these improved module designs are well suited for installation at dedicated sites where redundant elements can be eliminated where some common elements or features may be shared by many modules. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a photovoltaic module is provided comprising a module front layer comprising a glass plate, a module back layer comprising an electrically conductive foil, and a plurality of solar cells arranged to be protected by the front layer and the back layer. The use of a foil module back layer may reduce both module weight and module materials cost. In some embodiments, the module back layer an aluminum foil or an aluminum alloy foil. The module back layer may have an externally exposed surface. Optionally, the module back layer may be electrically grounded. In some embodiments, an electrically insulating pottant material may be used with the solar cells to separate them from the module back layer. This allows for a high voltage withstand between the cells and the outer surface of the back layer.

Optionally, the following may also be adapted for use with any of the embodiments disclosed herein. The foil may be anodized on one or more sides. This may improve high voltage withstand. The foil may be externally exposed. The foil may have a cross-sectional thickness of about 25 microns or more. The foil may have an externally exposed surface. The foil may be comprised of one or more substantially planar sheets of metallic material. The foil may be a flexible sheet of material. The foil may include an outer protective layer. The foil may include an outer moisture barrier layer. The foil may include an outer corrosion protection layer. The foil may have a thickness between about 50 microns to about 500 microns. The foil may have a thickness between about 50 microns to about 200 microns. The foil may have a thickness between about 100 microns to about 150 microns. The foil and the glass plate may be substantially similar in size. The foil and the glass plate may be substantially similar in length and width. The foil may be separated from the cells through a pottant layer of sufficient thickness and dielectric resistance to withstand about 600V between the cells and the foil. The foil may be separated from the cells through a pottant layer of sufficient thickness and dielectric resistance to withstand about 1000V between the cells and the foil. The foil may be separated from the cells through a pottant layer of sufficient thickness and dielectric resistance to withstand about 3000V between the cells and the foil. The foil may be further comprised of a layer of butyl rubber adhesive containing silane primer.

Optionally, the following may also be adapted for use with any of the embodiments disclosed herein. The pottant layer may be comprised of one or more selected from the group consisting of: Tefzel®, ethyl vinyl acetate (EVA), polyvinyl butyral (PVB), ionomer, silicone, thermoplastic polyurethane (TPU), thermoplastic polyolefin (TPO), tetrafluoroethylene hexafluoropropylene vinylidene (THV), fluorinated ethylene-propylene (FEP), saturated rubber, butyl rubber, thermoplastic elastomer (TPE), flexibilized epoxy, epoxy, amorphous polyethylene terephthalate (PET), urethane acrylic, acrylic, other fluoroelastomers, other materials of similar qualities, or combinations thereof. The pottant layer may have a thickness between about 25 microns to about 500 microns. The module may include a pottant layer positioned to prevent direct contact between the cells and the glass plate. The module may include a mesh layer used in combination with a pottant layer. The mesh layer may be comprised of a fiberglass layer. The mesh layer may be comprised of borosilicate glass cloth located closer to the solar cells than the conductive foil. The mesh layer may have a thickness in the range of about 50 microns to about 200 microns. The foil may be conductive and set at the voltage potential of one of the cells of the module. The foil may be conductive and set at the voltage potential of one of the cells of the module via an electrical connection. The foil may be additionally encapsulated from the environment through a fiber sheet of sufficient thickness and dielectric resistance to withstand about 600V between the foil and the environment. The foil may be additionally encapsulated from the environment through a fiber sheet of sufficient thickness and dielectric resistance to withstand about 1000V between the foil and the environment. The foil may be additionally encapsulated from the environment through a fiber sheet of sufficient thickness and dielectric resistance to withstand about 3000V between the foil and the environment.

Optionally, the following may also be adapted for use with any of the embodiments disclosed herein. The module may be further comprised of a moisture barrier positioned to prevent moisture entering between the glass plate and the foil. The moisture barrier may be positioned at least partially between the glass plate and the conductive foil, wherein the moisture barrier extends substantially around an entire perimeter of the glass plate. The moisture barrier may be comprised of one or more selected from the group consisting of: butyl rubber, acrylic, silane based adhesive, or similar adhesives. The moisture barrier may contain desiccant.

Optionally, the following may also be adapted for use with any of the embodiments disclosed herein. The module may be further comprised of spacers to maintain a minimum spacing between the glass plate and the electrically conductive foil. The spacers include one or more of the following selected from the group consisting of: particles, fibers, meshes, or combinations thereof. The spacers may be one or more of the following cross-sectional shapes selected from the group consisting of: circular, square, rectangular, triangular, oval, hexagonal, polygonal, star, or combinations thereof. The spacers may remain hard and substantially incompressible at temperatures of about 150° C. and pressures of about 0.1 MPa. The spacers may be substantially uniformly distributed between the front layer and the back layer. The number or distributed area of spacers may be enough to consistently space all the portions of the solar cell circuit from the back layer. The spacers may maintain a minimum separation of about 0.9 mm to about 1.1 mm. The spacers may be comprised of spheres with about 0.9 mm diameter and space of about 1 per 50 mm2 at module clip or mounting positions The spacers may be comprised of spheres positioned both above and below and electrical lead exiting between the glass plate and the conductive foil, wherein the spacers have about a 0.4 mm diameter and are spaced about 1 per 10 mm2 at exit locations of the electrical lead from the module. The spacers may be embedded in the moisture barrier.

Optionally, the following may also be adapted for use with any of the embodiments disclosed herein. The solar cells may have a thickness of about 300 microns or less. The solar cells may have a thickness of about 500 microns or less. The solar cells may be non-silicon based solar cells. The solar cells may be amorphous silicon solar cells. The solar cells include a copper-indium-selenide based alloy in the absorber layer. The solar cells may include an absorber layer having one or more inorganic materials from the group consisting of: titania (TiO2), nanocrystalline TiO2, zinc oxide (ZnO), copper oxide (CuO or Cu2O or CuxOy), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, silicon, cadmium selenide (CdSe), cadmium suflide (CdS), copper sulfide (Cu2S), cadmium telluride (CdTe), cadmium-tellurium selenide (CdTeSe), copper-indium selenide (CuInSe2), cadmium oxide (CdOx), CuI, CuSCN, a semiconductive material, or combinations of the above. The solar cells may include an absorber layer having one or more organic materials from the group consisting of: a conjugated polymer, poly(phenylene) and derivatives thereof, poly(phenylene vinylene) and derivatives thereof (e.g., poly(2-methoxy-5-(2-ethylhexyloxy)-1,4-phenylene vinylene (MEH-PPV), poly(paraphenylene vinylene), (PPV)), PPV copolymers, poly (thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly (thienylenevinylene) and derivatives thereof, and poly (isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone and pentacene, pentacene derivatives and/or pentacene precursors, an N-type ladder polymer, poly(benzimidazobenzophenanthroline ladder) (BBL), or combinations of the above. The solar cells include an absorber layer having one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above. The solar cells may include an absorber layer having one or more materials from the group consisting of: a nanostructured layer having an inorganic porous template with pores filled by an organic material (doped or undoped), a polymer/blend cell architecture, a micro-crystalline silicon cell architecture, or combinations of the above. The solar cells may be rigid solar cells. The solar cells may be flexible solar cells.

Optionally, the following may also be adapted for use with any of the embodiments disclosed herein. The module may be further comprised of mounting clips to be coupled to the module to secure it to an external support, wherein the mounting clip has a first surface that engages the glass plate front layer and a larger second surface that engages the foil back layer. The module may have a weight of about 17 kg or less. The module may have a weight of about 15 kg or less. The module may have a weight of about 14 kg or less. The module may have a length between about 1660 mm and about 1666 mm. The module may have a length between about 1640 mm and about 1680 mm. The module may have a width between about 700 mm and about 706 mm. The module may have a width between about 700 mm and about 870 mm. The glass plate may have a thickness in the range of about 3.0 mm to about 7.0 mm. The glass plate may have a thickness in the range of about 4.0 mm to about 6.0 mm. The glass plate may be comprised of solar glass substantially transparent in a spectral range from about 400 nm to about 1100 nm. The module may without a frame around a perimeter of the glass plate. The module may include a frame around a perimeter of the module.

Optionally, the following may also be adapted for use with any of the embodiments disclosed herein. The module may be further comprised of one or more electrical leads extending outward from an edge of module between the glass plate and the conductive foil. A housing may be placed over the exiting electrical leads to provide protection and/or strain relief. The housing may be an edge connector. The edge connector may include a by-pass diode. The module may be further comprised of one or more edge connectors mounted along the periphery of the module to allow for electrical connectors to exit from between the glass plate and the conductive foil while minimizing moisture entry. The module may be further comprised of a first electrical lead extending outward from one of the photovoltaic cells without passing the lead through a central junction box, and a second electrical lead extending outward from one of the photovoltaic cells without passing the lead through the central junction box. The module may be further comprised of one or more corner protectors to seal the glass plate and conductive foil at the corners. The module may have at least four locations for attaching mounting brackets to the module. The module may be configured as a roofing tile.

In another embodiment of the present invention, a photovoltaic module with a fold seal is provided. The module comprises of a rigid transparent front layer, an electrically conductive foil back layer, and a plurality of solar cells arranged to be protected by the front layer and the back layer, wherein the conductive foil is wrapped around to cover an edge of the front layer and/or an edge and a portion of the front surface of the front layer. The wrapping of the foil forms the fold seal that improves reliability of the module by providing additional barrier material to prevent side-ways moisture entry between the module layers. In some embodiments, the rigid transparent front layer comprises a glass plate. A butyl rubber adhesive containing a silane primer may be used to adhere the foil layer to the glass plate.

Optionally, the following may also be adapted for use with any of the embodiments disclosed herein. The foil may be electrically conductive and set at a voltage potential of one of the solar cells of the module. The foil may cover the edge of the front layer provides a moisture barrier to prevent moisture entry between the front layer and the back layer. The module may be further comprised of an adhesive between at least the front layer and the foil covering the edge of the front layer. The module may be further comprised of a butyl rubber adhesive containing silane primer, wherein the adhesive is between at least the front layer and the foil covering the edge of the front layer.

In yet another embodiment of the present invention, a method is provided comprised of forming a module comprising a rigid transparent front layer, an electrically conductive foil back layer, and a plurality of solar cells arranged to be protected by the front layer and the back layer.

In yet another embodiment of the present invention, a method is provided comprised of installing a plurality of modules, wherein each of the modules comprises a rigid transparent front layer, an electrically conductive foil back layer, and a plurality of solar cells arranged to be protected by the front layer and the back layer. The modules may be installed in landscape configuration.

In yet another embodiment of the present invention, a photovoltaic power installation is provided comprised of a plurality of a modules, wherein each of the modules comprises a rigid transparent front layer, an electrically conductive foil back layer, and a plurality of solar cells arranged to be protected by the front layer and the back layer The solar cells may be positioned between the front layer and the back layer.

Optionally, the following may also be adapted for use with any of the embodiments disclosed herein. The modules may be mounted in landscape configuration. The installation may be further comprised of a plurality of electrical leads from each of the modules, wherein adjacent modules are coupled together by at least one of the electrical leads extending outward from the modules without passing through a central junction box on the modules to reach an adjacent module. The electrical leads may include connectors each having a length less than about 2× a distance separating adjacent modules, wherein length is measured based on the portion of the connector located outside of the modules. The modules may be coupled in a series interconnection. The modules may be mounted on to support rails and the support rails are mounted to support beams. The modules may be frameless modules. The modules in one physical row may be electrically coupled in series. The modules may be in one row of the installation and wherein subsets of the modules in the row are coupled in series. The modules one row of the installation may be coupled in series, wherein connections between rows are in parallel. The modules in one row of the installation may be electrically coupled in series, wherein connections between rows are in series. The modules may be frameless and mounted on a plurality of rails, wherein the rails carry electrical charge between modules. The modules may be ground mounted. The modules are roof mounted. The modules may be roof mounted on low profile, angled mounting brackets coupled to the roof.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Foil Back Layer Photovoltaic Module

Figure 1:
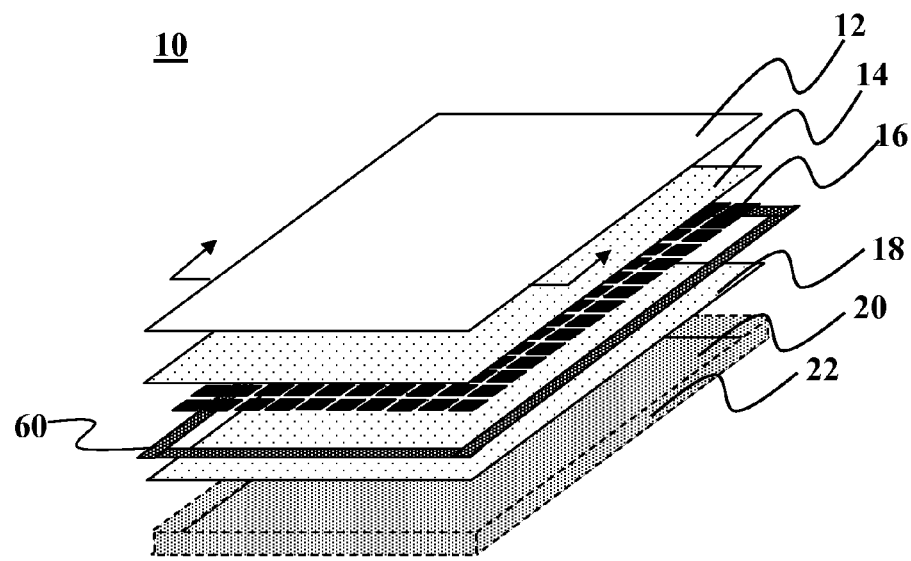
FIG. 1 is an exploded perspective view of an module according to one embodiment of the present invention.

Referring now to FIG. 1, one embodiment of a module 10 according to the present invention will now be described. FIG. 1 shows that the present embodiment of module 10 may include a transparent module front layer 12 followed by a pottant layer 14, a plurality of solar cells 16, optionally a second pottant layer 18, and a module back layer 20. By way of nonlimiting example, the transparent front layer 12 may be a substantially transparent glass plate that provides structural support and acts as a protective barrier. The pottant layers 14 and 18 may be of the same or different pottant materials. Advantageously, the module back layer 20 in the present embodiment may be a conductive metal foil that provides a low cost, light weight backside protective barrier for the solar cells 16 in the module 10. This type of module back layer eliminates the traditional back layer used in conventional modules which are either heavy such as glass, expensive such as Tedlar®/Aluminum/polyester/Tedlar® (TAPT) laminate, or both. A conductive foil module back layer 20 in conjunction with only one glass front layer 12 creates a significantly lighter module while retaining a robust design and simplifying module manufacturing. This results in significantly lower module cost as compared to conventional glass-glass, glass-film-framed, or glass-film-unframed modules.

Referring still to FIG. 1, the various components of module 10 will be described in further detail. As seen in this embodiment, the module 10 may include a transparent front layer 12 that may be a glass plate comprised of one or more materials such as, but not limited to, conventional glass, float glass, solar glass, high-light transmission glass with low iron content, standard light transmission glass with standard iron content, anti-glare finish glass, anti-reflective finish, glass with a stippled surface, glass with a pyramidal surface, glass with textured surface, fully tempered glass, heat-strengthened glass, annealed glass, or combinations thereof. Module front layer 12 is not limited to any particular shape, and it may be rectangular, square, oval, circular, hexagonal, L-shaped, polygonal, other shapes, or combinations of any of the foregoing. The total thickness of the glass or multi-layer glass for layer 12 may be in the range of about 2.0 mm to about 13.0 mm, optionally from about 2.8 mm to about 12.0 mm. In another embodiment, the layer 12 has a total thickness of about 2.0 mm to 6.0 mm. In another embodiment, the layer 12 has a total thickness of about 3.0 mm to 5.0 mm. In yet another embodiment, the front layer 12 has a thickness of about 4.0 mm. It should be understood that in some embodiments, the transparent front layer 12 may be made of a non-glass material that provides a transparent rigid plate. Optionally, the front layer 12 whether it is glass or non-glass is substantially transparent in a spectral range from about 400 nm to about 1100 nm. Optionally, some embodiments of the present invention may have surface treatments applied to the glass such as but not limited to filters, anti-reflective layers, surface roughness, protective layers, moisture barriers, or the like. Although not limited to the following, the top layer is typically glass except those with anti-reflective finish which consists of one or more thin film layers applied to the glass.

Referring still to the embodiment of FIG. 1, the pottant layer 14 in module 10 may be any of a variety of pottant materials such as, but not limited to, ethyl vinyl acetate (EVA), polyvinyl butyral (PVB), ionomer, silicone, thermoplastic polyurethane (TPU), thermoplastic polyolefin (TPO), tetrafluoroethylene hexafluoropropylene vinylidene (THV), fluorinated ethylene-propylene (FEP), Tefzel® (ETFE), saturated rubber, butyl rubber, thermoplastic elastomer (TPE), flexibilized epoxy, epoxy, amorphous polyethylene terephthalate (PET), urethane acrylic, acrylic, other fluoroelastomers, other materials of similar qualities, or combinations thereof. The module 10 may have one or more pottant layers. Optionally, some embodiments of module 10 may have two or more pottant layers. The thickness of each pottant layer may be in the range of about 10 microns to about 1000 microns, optionally between about 25 microns to about 500 microns, and optionally between about 50 to about 250 microns. The module may use a layer of pottant that is thinner than about 200 microns. In one embodiment, the pottant layer 14 is about 100 microns in cross-sectional thickness. In another embodiment, the pottant layer 14 is about 50 microns in cross-sectional thickness. In yet another embodiment, the pottant layer 14 is about 25 microns in cross-sectional thickness.

In some embodiments where the module has two pottant layers, the second pottant layer 18 is about 100 microns in cross-sectional thickness. Optionally, the second pottant layer 18 is about 400 microns in cross-sectional thickness. Again, the thickness of the second pottant layer may be between the range of about 10 microns to about 1000 microns, optionally between about 25 microns to about 500 microns, and optionally between about 50 to about 250 microns. The pottant layers 14 and 18 may be of the same or different thicknesses. They may be of the same or different pottant material. Although not limited to the following, the pottant layers 14 or 18 may be solution coated over the cells or optionally applied as a sheet that is laid over cells under the transparent module layer 12. Further details about the pottant and other protective layers can be found in commonly assigned, co-pending U.S. patent application Ser. No. 11/462,359 filed Aug. 3, 2006 and fully incorporated herein by reference for all purposes. It should be understood the highly heat transmitting pottant materials may also be used and further details on such materials can be found in commonly assigned, co-pending U.S. patent application Ser. No. 11/465,783 filed Aug. 18, 2006 and fully incorporated herein by reference for all purposes.

It should be understood that the solar module 10 and any of the solar modules herein are not limited to any particular type of solar cell. The solar cells 16 may be silicon-based or non-silicon based solar cells. By way of nonlimiting example, the solar cells 16 may have absorber layers comprised of silicon (monocrystalline or polycrystalline), amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. Advantageously, thin-film solar cells have a substantially reduced thickness as compared to silicon-based cells. The decreased thickness and concurrent reduction in weight allows thin-film cells to form modules that are significantly thinner than silicon-based cells without substantial reduction in structural integrity (for modules of similar design). The solar cells 16 may have various cross-sectional thicknesses. In one embodiment, it may be about 300 microns in cross-sectional thickness. Other cells may have thicknesses in the range of about 30 microns to about 1000 microns or optionally, 50 microns to about 500 microns.

Referring still to FIG. 1, to provide a reduced material cost and simplified module design, a foil module back layer 20 may be used. Although not limited to the following, the foil may be a bare foil that forms the backside surface of the module without additional coatings on the expose foil surface. The module back layer 20 may be a conductive foil comprised of one or more of the following materials: aluminum, zinc-aluminum alloy coated steel (such as Galvalume®), Corrtan® steel (a controlled corrosion steel with an adherent oxide), tin-coated steel, chromium coated steel, nickel-coated steel, stainless steel, galvanized steel, copper, conductive-paint coated metal foil such as weather resistant polymer containing carbon fiber, graphite, carbon black, nickel fiber, nickel particles, combinations thereof, or their alloys. In one embodiment, the low cost module back layer 20 is an externally exposed aluminum foil. Although not limited to the following, the cross-sectional thickness of the aluminum foil may be between about 10 µm to about 1000 µm, optionally between about 50 µm and about 500 µm, or optionally between about 50 µm and about 200 µm. Such thicknesses may be desirable to provide for pinhole-free, cut-resistant, wrinkle-resistant performance. The use of a low cost, lightweight, corrosion resistant material is desirable to reduce cost and simplify module design.

Figure 2:
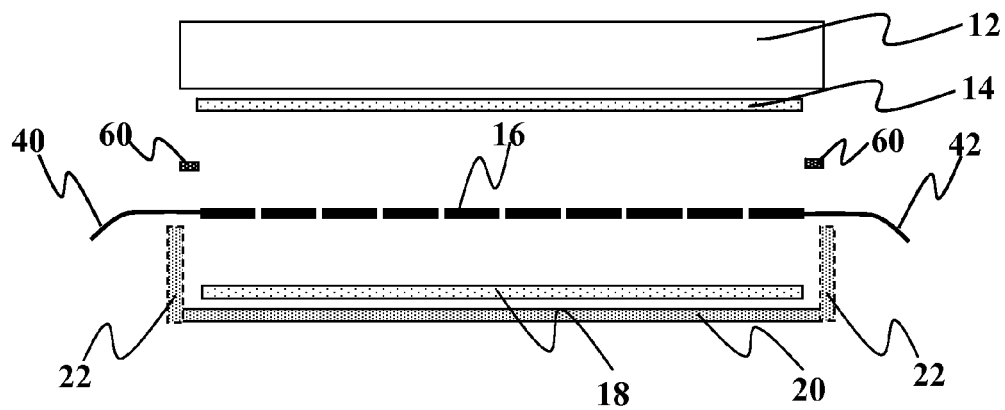
FIG. 2 shows a cross-sectional view of the embodiment of FIG. 1.

As seen in FIG. 2, the module back layer 20 may also be of various sizes and shapes and is not limited to being a rectangular sheet of material in only one plane of the module. FIG. 2 shows a cross-sectional view of the module of FIG. 1. By way of nonlimiting example, some embodiments of the module back layer 20 may be sized to cover not only the back of the module 10 but also include portions 22 (shown in phantom) which may extend to cover one or more of the side edges of the module 10. The use of vertical portions 22 of module back layer 20 may improve the moisture barrier quality of the module 10 as it provides a continuous length of material that covers both the back of module and possible sideways moisture entry points from between the module front layer 12 and the module back layer 20. As the portions 22 are continuous with the layer 20, this reduces the number seams or seals that would exist if these elements were separate pieces. Additional details of the fold seal formed along the edges of module 10 are described in FIG. 4.

Referring still to FIG. 2, the present embodiment of module 10 shows a frameless module without a central junction box with electrical ribbons 40 and 42 for electrically coupling adjacent modules together. Although not limited to the following, the electrical lead wires/ribbons 40 and 42 may extend outward from between the module front layer 12 and the module back layer 20. These ribbons 40 and 42 are designed to exit along the sides of the module, between the various layers 12 and 20, rather than through them. This simplifies the issue of having to form openings in back layer or the front layer which may be an issue if the openings are improperly formed during such procedures. The electrical lead 42 may extend from one side of the cell 16 (either top or bottom) and not necessarily from the middle. The ribbon 40 may connect to a first cell in a series of electrically coupled cells and the ribbon 42 may connect to the last cell in the series of electrically coupled cells. The wires or ribbons 40 and 42 may optionally have a coating or layer to electrically insulate themselves from the backsheet 20. Optionally in some alternative embodiments, the wires or ribbons 40 and 42 may exit through an opening in the conductive metal foil layer (see FIG. 20). FIGS. 1 and 2 also show that a moisture barrier 60 may be positioned around the perimeter of the module. This barrier 60 may be at least partially enclosed by the module front layer 12 and module back layer 20. The barrier 60 may be comprised of a seal material alone or a seal material loaded with desiccant.

In some embodiments, a moisture barrier 60 may be included to prevent moisture entry into the interior of the module. The moisture barrier 60 may optionally extend around the entire perimeter of the module or only along select portion. In one embodiment, the moisture barrier 60 may be about 5 mm to about 20 mm in width (not thickness) around the edges of the module. In one embodiment, the moisture barrier 60 may be butyl rubber, a zeolyte material, or other barrier material as described herein and may optionally be loaded with desiccant to provide enhanced moisture barrier qualities.

Module Voltage Withstand

Figure 3:
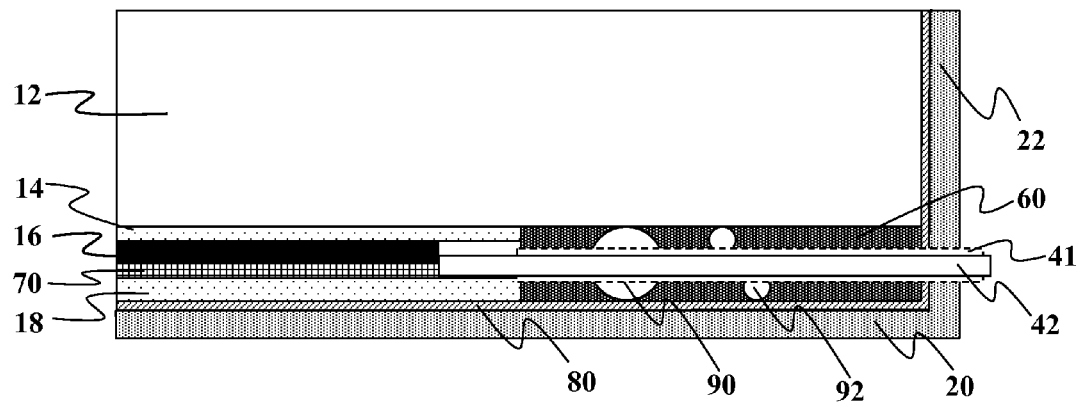
FIGS. 3 through 5 show cross-sectional views of various embodiments of the present invention.

Referring now to FIG. 3, in some embodiments of the present invention, it is desirable that the nearest point of approach from the cells 16 to the module back layer 20 be sufficiently far and/or through sufficiently electrically insulating material to provide a high voltage withstand. Although not limited to the following, embodiments of present invention may use a pottant material that provides both encapsulating qualities and electrically insulating qualities to achieve the desired insulating quality. In one embodiment, the high voltage withstand between the cells 16 and the module back layer 20 is at least about 500V. Optionally, the high voltage withstand is at least about 1000V. Optionally, the high voltage withstand is at least about 2000V. Optionally, the high voltage withstand is at least about 3000V. Optionally, the high voltage withstand is at least about 4000V. Of course, some embodiments of modules operated in secure, limited access facilities may be designed without any particular voltage withstand (i.e. 500V or less) as the limited access nature allows only qualified personnel near the modules in conditions when it is safe to do so.

As seen in FIG. 3, to achieve the desired voltage withstand, various elements may be incorporated into the module. In one embodiment, spacers are used to maintain distance between the cells 16 to the foil 20. Two nonlimiting examples of suitable spacers include: 1) a spacer layer 70 of nonwoven or woven glass cloth with small mesh impregnated with one of the following: TPO, ionomer, TPU, EVA, or similar encapsulating pottant with thickness between 50 µm and 500 µm (thicker is higher voltage withstand) or 2) a stack of small mesh glass cloth (or thin, hard, temperature-resistant polymer film such as 25 µm of PET) on top of large mesh glass cloth 70 to separate the roles of high uniformity of spacing from high thickness of spacing, where the stack is impregnated with encapsulant of the type previously recited herein. In some embodiments, the spacer 70 has a thickness in the range of about 75 microns to about 150 microns. In some embodiments, the spacer 70 has a thickness in the range of about 50 microns to about 300 microns. In some embodiments, the spacer 70 has a thickness in the range of about 200 microns to about 500 microns. In some embodiments, the spacer layer 70 is about 100 microns in thickness. The pottant layer 18 may be designed to flow into the openings in glass cloth 70. Optionally, the hard spacer in layer 70 should be hard to ensure consistent spacing performance under pressure. The spacers are preferably temperature resistant to remain hard under peak lamination temperature which in one embodiment is about 150° C. and pressure of about 1 Atm (ca. 0.1 MPa). The number or distributed area of spacers may be enough to consistently space all the portions of the solar cell circuit from the module back layer 20.

As seen in FIG. 3, the thicknesses of pottant layers 14 and 18 may be asymmetric, with pottant layer 18 being thicker than upper pottant layer 14. This may be desirable to maintain a greater spacing between the cells 16 and back layer 20 to maximize the electrical insulation between these layers. It should also be understood that the material for pottant layer 18 may be selected to be electrically insulating. In some embodiments, the material in pottant layer 18 is more electrically insulating than the material used in the upper pottant layer 14. Optionally, the pottant layer 18 through its cross-sectional thickness and material quality provides about 500V high voltage withstand between the cell 16 and the outer, exposed surface of module back layer 20. In another embodiment, the pottant layer 18 provides about 1000V high voltage withstand between the cell 16 and the outer, exposed surface of module back layer 20. In another embodiment, the pottant layer 18 provides about 2000V high voltage withstand between the cell 16 and the outer, exposed surface of module back layer 20. In another embodiment, the pottant layer 18 provides about 3000V high voltage withstand between the cell 16 and the outer, exposed surface of module back layer 20. In yet another embodiment, the pottant layer 18 provides about 4000V high voltage withstand between the cell 16 and the outer, exposed surface of module back layer 20. In some other embodiments, it total combination of the pottant layer with spacer layer 70 that provides the above listed high voltage withstand. Material that is more voltage withstanding includes silicones, polyimides such as Kapton®, polyesters such as Mylar®, halogenated, aromatic, or polymeric materials. For insulation based on air spacing, an air spacing of 2 mm is used for 600V rating to 10 mm for 4000V rating. These are merely exemplary and nonlimiting.

Optionally, additional insulating material may be formed on the foil, such as but not limited to anodization. Optionally, other embodiments may use more electrically insulative pottant material. Any of the options may be used singly or in combination. In still other embodiments, it is the combination of all layers between the cell 16 and the outer, exposed surface of module back layer 20 that provides this high voltage withstand. The use of an electrically insulating pottant material for layer 18 optionally allows the layer 20 to be used without having to add additional insulating layers such as a layer of Tedlar® found in traditional module configurations that increase materials cost. The present invention may slightly thicken the aluminum foil while also eliminating, reduce, or "reduce-and-move" the polyester film also found in conventional module. Additionally, as seen in FIG. 3, there may be an electrically insulating material 41 optionally used with the electrical ribbon or wire 42. The insulating material 41 may be in the form of a sleeve completely surrounding the ribbon or wire 42. It may also be in any other form such as but not limited to a piece above, below, and/or around the electrical ribbon or wire 42 to electrically insulate it from the module back layer 20. In one embodiment, the electrically insulating material may be a polymer, butyl rubber, glass, an insulating fabric/weave, or other insulating material. The insulating feature may be used with any embodiments herein and is not limited to those embodiments where the metal foil is wrapped around the side of the module.

It should also be understood that for aesthetic reasons, the pottant layer 18 may contains pigment to provide the pottant layer 18 with a particular color. In one embodiment, the pottant layer 18 may be black in color. In another embodiment, the pottant layer 18 may be white in color.

Fold Seal

Figure 4:
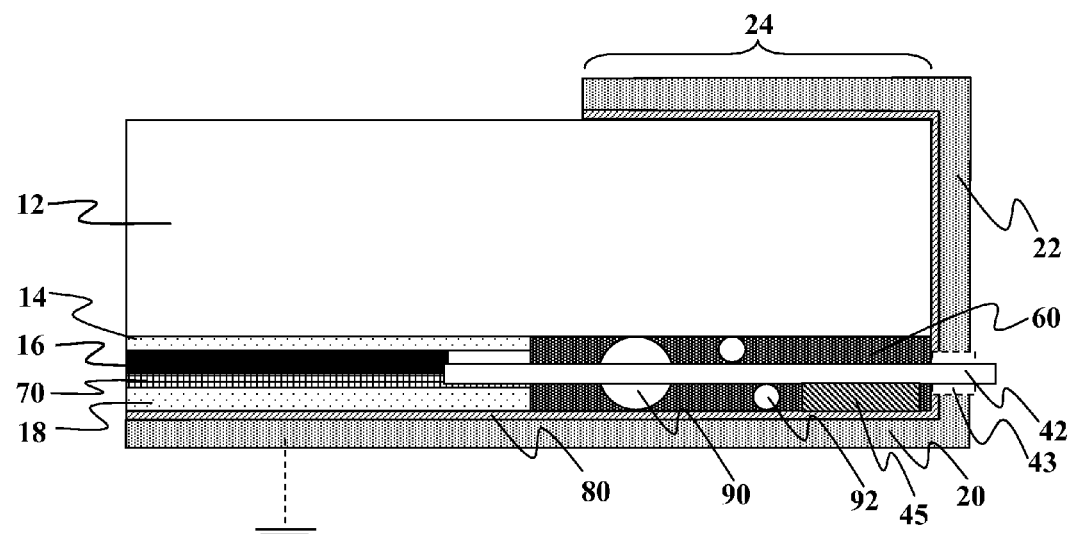

Referring now to FIG. 4, it is seen that the foil layer 20 may also have a portion 24 that extends to a front side surface of the front layer 12. This improves the mechanical qualities of the bond between the foil layer 20 and the module 10 by having bonds on opposing surfaces of the module (i.e. on both the front surface and the back surface). This additional portion 24 also increases the path length that moisture would need to pass through if moisture were to try to enter between the foil layer 20 and front layer 12 to reach the cells 16 as indicated by arrows 26. In one embodiment, the length of section 24 may be of the same dimension as the width of underlying moisture barrier 60. The section 24 may be sized so as not to extend over any portion of the solar cells 16 so as to shade them or reduce their electrical output. In some embodiments, the length of section 24 may be between about 1 mm to about 20 mm, optionally between about 2 mm and about 15 mm. The optional edge folded version of the aluminum back layer 20 may provide for improved reliability. The optional folded edge of the aluminum back sheet can be adhered to the glass coversheet of the solar module with thin or thick adhesives, with or without desiccant additive, with or without glass adhesion promoter (typically silane-based). It can also be seen that the module back layer in FIG. 4 or any of the embodiments herein may be grounded. FIG. 4 also shows that an optional insulating material 43 may be used to prevent electrical contact with the metal foil. Some embodiments may use an insulating material 45 that is only above or below the wire or ribbon 42. In one embodiment, the electrically insulating material may be a polymer, butyl rubber, glass, an insulating fabric/weave, or other insulating material. The insulating feature or features may be used with any embodiments herein and is not limited to those embodiments where the metal foil is wrapped around the side of the module.

For the embodiments of FIGS. 3 and 4 which include an adhesive layer, the adhesive layer 80 may be included between the foil module layer 20 and the other elements of the module 10. This adhesive layer 80 is of particular use in adhering the foil module layer 20 to any hard smooth surface such as the surfaces of module front layer 12. The adhesive layer 80 may be comprised of one or more of the following: butyl rubber, silane primer, polyurethane, acrylic, saturated rubber, unsaturated rubber, thermoplastic elastomer (TPE), thermoplastic olefin, acrylic-based adhesive, urethane-based adhesive, EVA, PVB, TPU, ionomer, flexibilized epoxy, epoxy, or similar adhesives. Water vapor transmission rate (WVTR) of the adhesive is important in embodiments with moisture sensitive solar cells. Butyl rubber adhesive is one suitable adhesive type with low WVTR. The thickness of adhesive layer 80 may be in the range of about 10 to about 50 microns. In another embodiment, the adhesive layer 80 may be about 25 microns in thickness. The adhesive layer 80 may cover the entire surface of the foil layer 20 and other continuous portions of the foil such as section 22. Optionally, the adhesive layer 80 covers select areas of the back layer 20 such as but not limited to areas of contact between the back layer 20 and the front module layer 12.

In manufacturing a module with a fold seal, it should understood that for embodiments with edge exiting electrical connectors, the openings to allow an edge exiting connector (see FIG. 19A) to extend from the module may be formed before the layer 20 is coupled to the module, after a portion of the layer 20 is coupled to the module, or after the layer 20 is coupled and the fold seal adhered.

Spacers

FIGS. 3 and 4 also show that spacers 90 and 92 may be included between the module front layer 12 and the module back layer 20. The spacers 90 and 92 may be sized to provide a minimum spacing between the module front layer 12 and the module back layer 20. This prevents compression or pinching that may result in undesired stress and material delamination during the manufacturing process. In one nonlimiting example, the spacers 90 may be spherical borosilicate particles with diameters of about 0.9 mm at a quantity of about 1 per 50 mm$^2$ at clip mounting regions. Smaller spacers 92 may be used in regions over or under the electrical ribbon 42. The combination of the spacers 92 and the ribbon 42 also provides a minimum spacing to prevent over-compression of the layers at the ribbon exit regions during manufacturing steps such as vacuum lamination or other types of lamination. In one nonlimiting example, the spacers 92 may be spherical borosilicate particles with diameters of about 0.4 mm at a quantity of about 1 per 10 mm$^2$ at ribbon exit regions of the module 10. In one embodiment, the exit ribbon has a cross-sectional thickness of about 0.125 mm.

Figure 5:
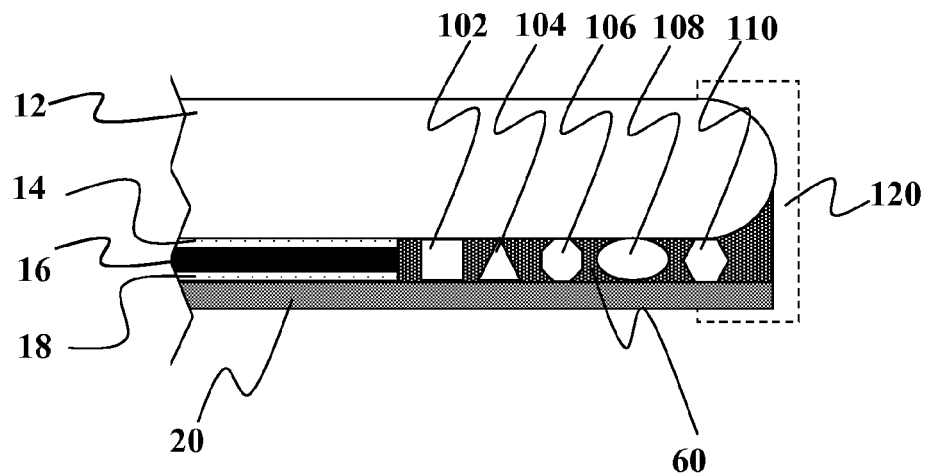

Referring now to FIG. 5, the spacer particles 90 may be spherical but can also be particles of other shapes. In one embodiment, the particles 90 may be cylinders of constant diameter and length greater than the cylinder diameter, up to the about the length of the module in the most extreme embodiment range. They may be individual fibers or fibers woven into a cloth. The fibers may be orient parallel, orthogonal, or angled in some manner. Although not limited to the following, the fibers may be of lengths between 1 and 10 diameters and are sometimes called short fibers. Intermediate and long fibers are additional alternatives. Optionally, the particles 90 may be square particles 102, triangular particles 104, octagonal particles 106, oval particles 108, hexagonal particles 110, combinations thereof, and/or other shapes that can define a minimal thickness for the moisture barrier 60. Optionally, all of the particles 90 may be of the same shape/size or there may be a mix of one or more shapes and sizes, so long as a minimum thickness is maintained after lamination. The loading of particles 90 in the polymeric or other material has an upper limit of avoiding particle-particle jamming and consequently the laminate thickness held up to be thicker than a single particle diameter. FIG. 5 also shows that the module back layer 20 may extend only on the back side of the module and not along the sides. It should also be noted that in addition to glass spacers, other materials may also be used for the spacer. In some alternative embodiments where leakage current is prevented in the module despite leaky spacers, the spacers may be made of one or more of the following: metal, steel, stainless steel, aluminum, aluminum alloy, brass, bronze, iron, nickel, chromium, tin, or combinations thereof. Optionally, the spacers may be plastics spacers comprised of one or more of the following: acetal, delrin, acrylic, phenolic, nylon, polycarbonate, polyimide, polyester, or combinations thereof and glass-filled version of the above, either fiberglass or glass particles. Higher volumes or numbers of spacers may be used to compensate for lower material strength. The spacers may also be comprised of different materials such as soda lime glass, borosilicate glass, silica, quartz, fused quartz, other quartz, leaded glass, barium containing glass, ceramic, alumina, aluminosilicate, glass-mica ceramic, zirconium ceramic, silicon nitride ceramic, boron nitride ceramic, tungsten carbide, silicon carbide, or combinations thereof.

Hard spacers could be a random or precise monolayer of arrayed particles instead of or in combination with the fibers. The particles may be fixed to the back sheet before lamination. The particles or fibers may be temperature-resistant plastic or ceramic instead of glass. It is desirable in most embodiments that the particles or fibers support high voltage withstand with low leakage current. Other details regarding the spacers may be found in co-pending U.S. Patent Application Ser. No. 60/871,666 filed Dec. 22, 2006 and fully incorporated herein by reference for all purposes.

Moisture Barrier

As seen in FIG. 3, for any of the embodiments herein, a moisture barrier 60 may be used with the module 10 to improve the barrier seal along the edge perimeter of the module. The moisture barrier 60 may be positioned along the entire or substantially entire perimeter of the module 10. The barrier 60 may be sandwiched between the module layers to provide weatherproofing and moisture barrier qualities to the module. In some embodiments, the barrier is between the upper and lower layers 10 and 20. In other embodiments, it may be sandwiched between one or more of the pottant layers. In one embodiment, the moisture barrier 60 may be about 5 mm to about 20 mm in width (not thickness) around the edges of the module. The barrier 60 may be comprised of one or more of the following materials such as but not limited to desiccant loaded versions of EVA, Tefzel®, PVB, ionomer, silicone, TPU, TPO, THV, FEP, saturated rubber, butyl rubber, TPE, flexibilized epoxy, epoxy, amorphous PET, urethane acrylic, acrylic, other fluoroelastomers, other materials of similar qualities, or combinations thereof. By way of nonlimiting example, the desiccant may be selected from porous internal surface area particle of aluminosilicates, aluminophosphosilicates, or similar material. In one embodiment without desiccant, with module perimeter length of about 5 meters, moisture barrier height of 0.5 mm, moisture barrier width of 1 cm, then 0 to 0.25 g/m2 day cm at 50 C and 100% (humidity), is preferable, optionally 0 to 0.1 g/m2 day cm, optionally 0 to 0.01 g/m2 day cm. It should be understood that the moisture barrier 60 may be in the form of a preformed edge tape or it may be a hot melt paste or similar material that is extruded and applied directly to the module 10.

Optionally as seen in FIG. 5, a perimeter seal 120 (shown in phantom) outside the front layer and back layer may be used to provide a moisture barrier along the sides of the module 10. This perimeter seal 120 will reinforce the barrier properties along the sides of the module 10 and prevent sideway entry of fluid into the module. Seal 120 may be used in combination with the barrier 60 or in place of it. The seal 120 may be comprised of one or more of the following materials such as but not limited to desiccant loaded versions of EVA, PVB, ionomer, silicone, TPU, TPO, THV, FEP, Tefzel® (ETFE), saturated rubber, butyl rubber, TPE, flexibilized epoxy, epoxy, amorphous PET, urethane acrylic, acrylic, other fluoroelastomers, other materials of similar qualities, or combinations thereof. By way of nonlimiting example, some suitable material for barrier material include a high temperature thixotropic epoxy such as EPO-TEK® 353ND-T from Epoxy Technology, Inc., a ultraviolet curable epoxy such as EPO-TEK® OG 116-31, or a one component, non-conductive epoxy adhesive such as ECCOSEAL™ 7100 or ECCO-SEAL™ 7200 from Emersion & Cuming. By way of nonlimiting example, the desiccant may be selected from porous internal surface area particle of aluminosilicates, aluminophosphosilicates, or similar material. It should be understood that the seal 120 may be applied to any of the modules described herein to reinforce their barrier properties. In some embodiments, the seal 120 may also act as strain relief for ribbons, wires, or other elements exiting the module. Optionally, the seal 120 may also be used to house certain components such as bypass diodes or the like which may be embedded in the seal material.

It should also be understood that a ribbon 42 extending outward from the module may also have a shape-change occur in the barrier material 60 or the seal 120. By way of nonlimiting example, a flat ribbon 42 may transition to a round wire therein. Optionally, instead of and/or in conjunction with the shape change, transition of material may also occur. By way of nonlimiting example, the transition may be aluminum-to-copper, copper-to-aluminum, aluminum-to-aluminum (high flex), or other metal to metal transitions. Of course, the wire outside of the seal 120 and strain relief element is preferably electrically insulated.

Hard Spacers and Anodized Layers

Figure 6:
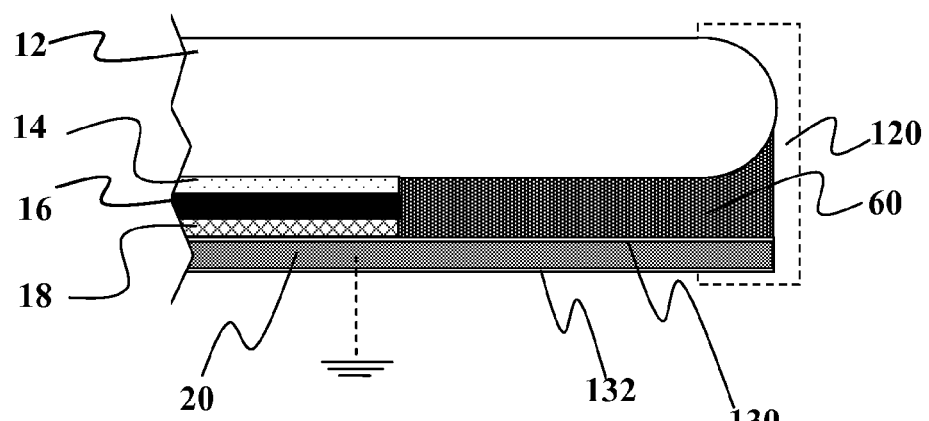
FIGS. 6-12 show various module cross-sections of embodiments according to the present invention.

Referring now to FIG. 6, a still further embodiment of the present invention will now be described. FIG. 6 shows that the module back layer 20 may be anodized to create further protective layers 130 and 132 on the module back layer 20. All aluminum generally has a native oxide (aluminum oxide) on the surface and is very thin. The native oxide is typically less than one micron thick, possibly much less than one micron. Anodization can significantly increase the amount of protection provided by an aluminum oxide layer.

In one technique, anodization of module back layer 20 may involve passing the aluminum through a sulfuric acid bath. Electric current is used to drive the reaction forward to make anodization occur quickly. The resulting aluminum oxide from anodization is a durable material since aluminum oxide is the base material for ruby or sapphire. In some embodiments, the hard anodization may be as thick as the foil used for module back layer 20. Depending on the thickness of the anodized layer, substantial electrical withstand may be provided by the anodized layer. For example, a defect-free anodized layer of about 50 microns thick will provide 2000 V electrical withstand. This protection, however, is somewhat unpredictable as it is defect limited. Since the anodized layer is typically defect ridden, simply creating a thicker layer is not enough to guarantee increased voltage withstand. However, it does provide a secondary layer of protection and improved cut resistance.

It should be understood that the protective layers 130 and 132 may be formed on one or both sides of the module back layer 20. The protective layers 130 and 132 may be designed for scratch resistance, cut resistance, and good cosmetics. An anodized layer is also corrosion resistant to solutions such as salt water. It should be understood that various grades and thicknesses of anodization may be adapted for use with module back layer 20. Some embodiments may go with something that is not as hard. Lightweight anodization may provide a protective layer in the thickness of about 10 to about 50 microns. There are also architectural class (1, 2, etc . . . ) of anodization providing layers in the thickness of about 10 to about 20 microns, optionally 20 to about 50 microns. In addition to thin anodization, some embodiment may have no additional anodization (i.e. just rely on native oxide) or they may include a polymer coating (laminated film or a wet coating that dries). Optionally, some embodiments only have anodization on one side of the module back layer 20, either on the bottom surface or the top surface. Any of the above may be adapted for use with the present invention.

As seen in FIG. 6, the solar cell 16 may include a pottant layer 14 between the cell and top layer 12. A hard spacer layer 18 may be included below the solar cell 16 to provide a minimum spatial separation between the cell and the module back layer 20. This spatial separation is used in part to define the high voltage resistance of the module. The hard spacer layer may be a layer of fiberglass or other woven material. Optionally, the woven material is electrically non-conductive. It should be understood that the hard spacer layer 18 may be infused with a pottant material such as but not limited to that in the pottant layer 14. The thickness of the hard spacer layer may be in the range of about 50 to about 500 microns, optionally 75 to about 300 microns, optionally about 100 to about 250 microns. In one embodiment, the spacer layer 18 is about 200 microns thick. The thickness of spacer layer 18 may be the same thickness as that of pottant layer 14. Optionally, they may be asymmetric with either pottant layer 14 thicker than layer 18 or vice versa.

Figure 7:
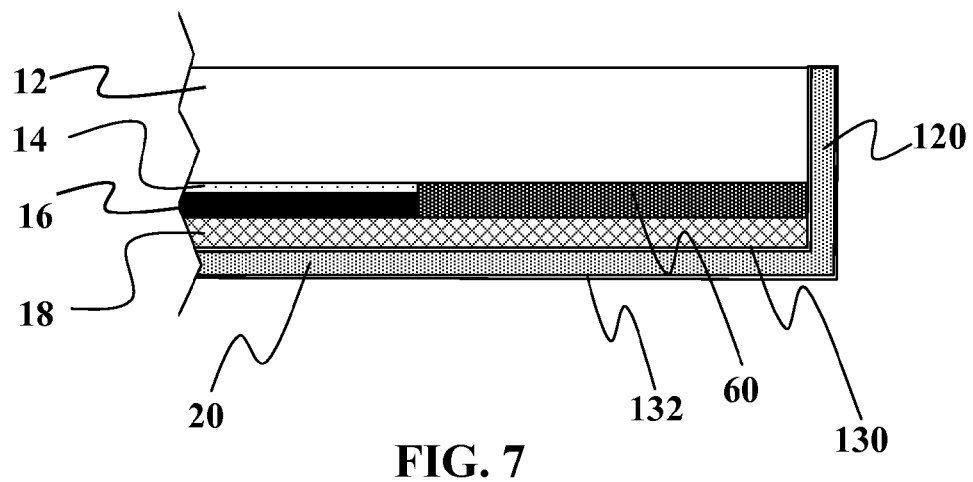

Referring now to FIG. 7, it should be understood that other variations may be incorporated into the module. For example FIG. 7 shows that the module back layer 20 may extend along the sides and/or to the top of the module. The hard spacer layer 18 may extend closer to the edge of the module and be situated partially underneath the moisture barrier 60. It can also be seen in this embodiment that the pottant layer 14 above the cell 16 is thinner than the spacer layer 18 below the cells.

Figure 8:
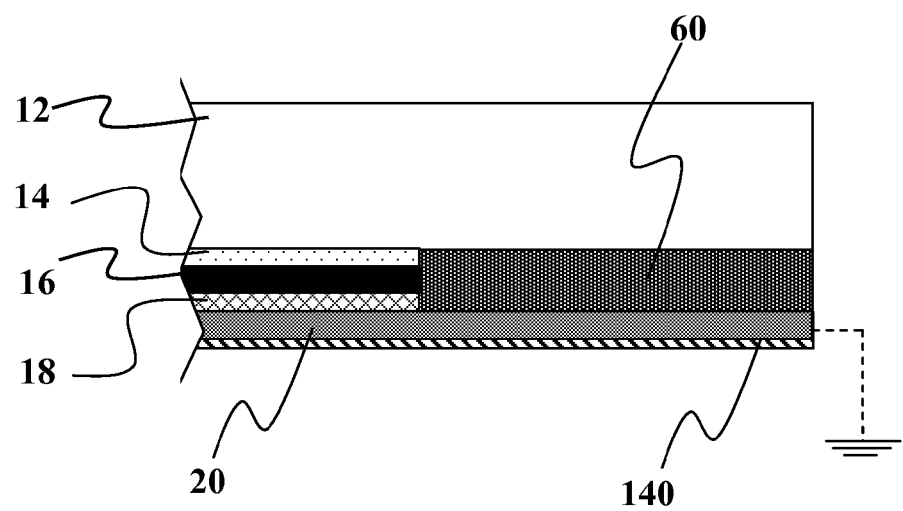

FIG. 8 shows that some backside module layers 20 may be treated to have just one side with an anodized layer 140. The anodized side with layer 140 may be on the underside of the module or it may be on the interior side of the module backside layer 20.

Multi-Layer Laminate

Figure 9:
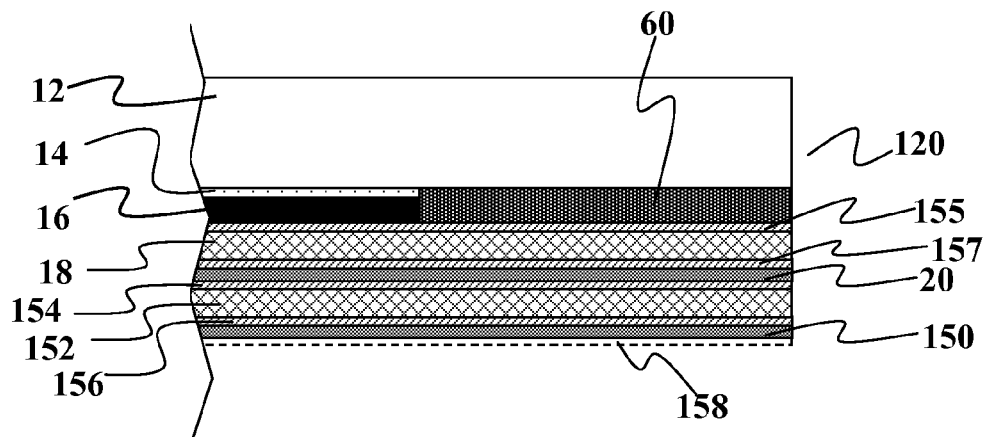

Referring now to the embodiment of FIG. 9, the module of the present may use a laminate concept to include more than one foil layer for the backside of the module. FIG. 9 shows that a second foil layer 150 may be included as a laminate layer for use with the foil layer 20. This second foil layer 150 provides a further moisture barrier and cut resistant barrier. An additional spacer layer 152 may be included between the foil layer 20 and 150. This second spacer layer 152 provides spatial separation between the two foil layers 20 and 150 to increase the voltage withstand. The spacer layer 152 may be infused with encapsulant or pottant material. As seen in FIG. 9, some of the pottant may extend above and/or below the hard spacer layer as indicated by areas 154 and 156. The pottant layers used between layer 20 and the cell may also include these extra areas 155 and 157 for pottant. The hard spacer layer 152 will define a minimum separation distance and the additional pottant material in areas 154 and 156 may provide some dampening of shock or physical impact. Optionally, the material used in areas 18 and/or 154 may be a foam material such as but not limited to polyurethane foam or other polymer foams. In some embodiments, these foams may be in a sandwich between two metal layers. An additional protective coating 158 (shown in phantom) similar to that described above for FIG. 11 may be optionally included for weather resistance and cosmetic benefit. Optionally, one or both foil layers 20 and 150 may be anodized and used with or without coating 158. Some embodiments may have layer 150 un-anodized with coating 158 and layer 20 anodized on one or more sides. One or more of these layers may also be extended vertically along the edge of the module and optionally onto a front side surface of top layer 12.

As seen in FIG. 9, different layers of different thicknesses may be used in the module. As one nonlimiting example, the layer 12 may be a glass layer in the thickness of about 3 mm to about 4 mm. The pottant layer 14 may be about 0.1 mm thick. The cells 16 may have a thickness of about 0.3 mm. Beneath the cells 16, the pottant layer 155 may be about 0.1 mm thick, the spacer layer 188 may be about 0.1 mm thick, and the pottant layer 157 about 0.2 mm, wherein thickness are based on pre-lamination thicknesses. After lamination, the total thickness of the layers 155, 188, and 157 may be in the range of about 0.32 mm due to penetration of the pottant layers into void spaces of the spacer layer 188. The foil layer 20 may have a thickness in the range of about 0.010 to about 0.500 mm. In this laminate configuration, foil layer 20 may function as a moisture barrier. Beneath the foil layer 20, the pottant layer 154 may be about 0.1 mm thick, the spacer layer 152 may be about 0.1 mm thick, and the pottant layer 156 about 0.1 mm, wherein thickness are based on pre-lamination thicknesses. Optionally, the pottant may be replaced or combined with an adhesive. Again post-lamination, the combined total thickness of all three layers may be in the range of about 0.22 mm due to penetration of the pottant layers into void spaces of the spacer layer 152. This second set of layers will provide cut resistance, stiffness, and/or strength. A second foil layer 150 may be placed beneath the layer 156 and act as a weather resistant barrier. It may have a thickness of about 0.025 mm to 0.150 mm. The layer 150 may include a native oxide layer that will also improve weather resistance.

Corrugated Backside Layer

Figure 10:
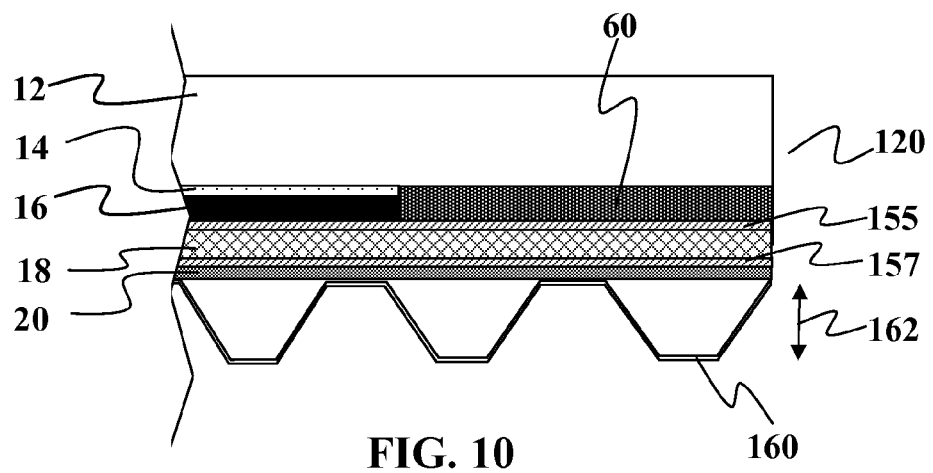

Referring now to the embodiment of FIG. 10, it should be understood that additional stiffening elements may be added to the module for protective purposes. FIG. 10 shows a corrugated structure 160 coupled to the underside of the module, in this case to the module back layer 20. The corrugated structure 160 may made of the same material as the module back layer 20, or optionally, it may be a different material. The structure 160 may be comprised of aluminum, aluminum alloy, copper, steel, stainless steel, galvanized steel, polymers, plastics, or the like. The thickness of the corrugated structure 160 as indicated by arrow 162 is in the range of about 2 mm to about 5 mm. The corrugation may be placed over the entire backside of the module, or optionally, it may be placed at specific locations where the module is mechanically coupled to ground support or other mounting elements. The material used for structure 160 may be about 75 microns or thicker, to provide the desired cut resistance.

Optionally, instead of corrugation, some module back layers 20 may be embossed or stamped with undulations or texturing to provide additional structural support. The embossing or stamping may also be useful for address any thermal expansion issues that may arise.

Coating

Figure 11:
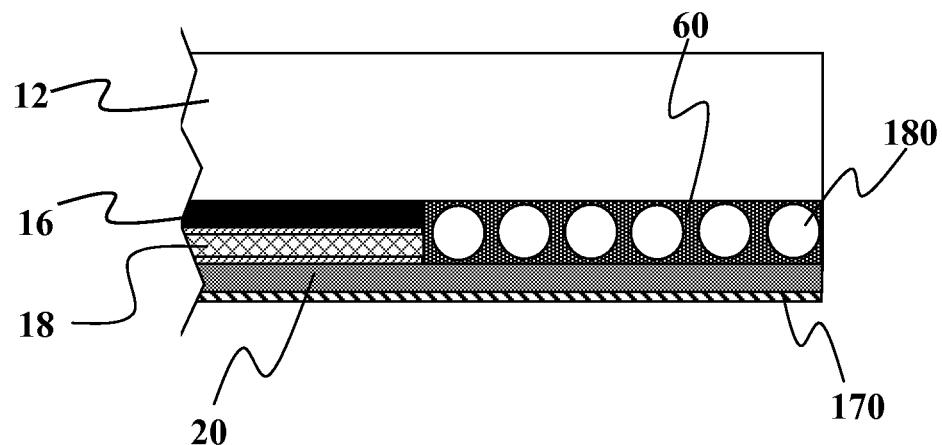

Referring now to FIG. 11, some backside module layers 20 may be laminated or covered with a protective coating 170 such as but not limited to paint. Weather resistance is one goal of such a coating, along with cosmetic benefits. Fading or discoloring could be avoided with such a coating. Optionally, instead of paint, the protective coating 170 may be polymer layer. Optionally, the protective coating 170 may be comprised of silicone polyester, silicone polyester with less than 30% silane, polyester, PVDF (Kynar®), high polymeric laminate, PVC plasti-sol, acrylic, and other fluoropolymers. The thickness of the protective coating 170 may be in the range of about 5 to about 50 microns. The foils used for the present embodiment may be in the thickness range of about 10 to about 500 microns. Optionally, some embodiments may use a Tedlar®/Aluminum/polyester (TAP) or TAPT back layer. This would replace the layer 20 and optionally the protective coating 170. This embodiment may be combined with a front glass or other transparent layer with a thickness of about 2.0 mm. Optionally, the front layer may be about 2.1 mm. Optionally, the front layer may be about 2.2 mm. Optionally, the front layer may be about 2.3 mm. Optionally, the front layer may be about 2.4 mm. Optionally, the front layer may be about 2.5 mm. Optionally, the front layer may be about 2.6 mm. Optionally, the front layer may be about 2.7 mm. Optionally, the front layer may be about 2.8 mm. It should be understood that any of these thickness may be adapted for use with any embodiments disclosed herein. The reduced thickness substantially reduces weight which may be particular use in situation such as but not limited to roof top mountings where the roofs are designed to carry only minimal loads. If a module with 3.2 mm front glass and 2.0 back glass with an area of 1162000 mm2 weighs 16 kg, then a 2.0 mm thickness front glass module with foil back side may weigh less than about 8 kg. Optionally, some may weigh less than 7 kg. Optionally, some embodiments may weight less than 6 kg.

As seen in FIG. 11, a variety of spacers 180 may also be included in moisture barrier 60 to maintain a minimum spatial separation between the top layer 12 and the module back layer 20. The spacers may be spherical beads comprises of materials such as glass which are substantially incompressible for the pressures to be encountered during manufacturing. It should be understood that spacers may be used with any of the embodiments disclosed herein.

FIG. 11 also shows that the cells 16 may be in direct contact with the top layer 12 and there is no pottant layer therebetween. This allows for embodiments where the cells 16 or other photovoltaic material are formed directly on the layer 12. Optionally, this may include placing cells 16 in contact with the layer 12 and include pottant material around the cells, but not between the cell and the layer 12.

Figure 12:
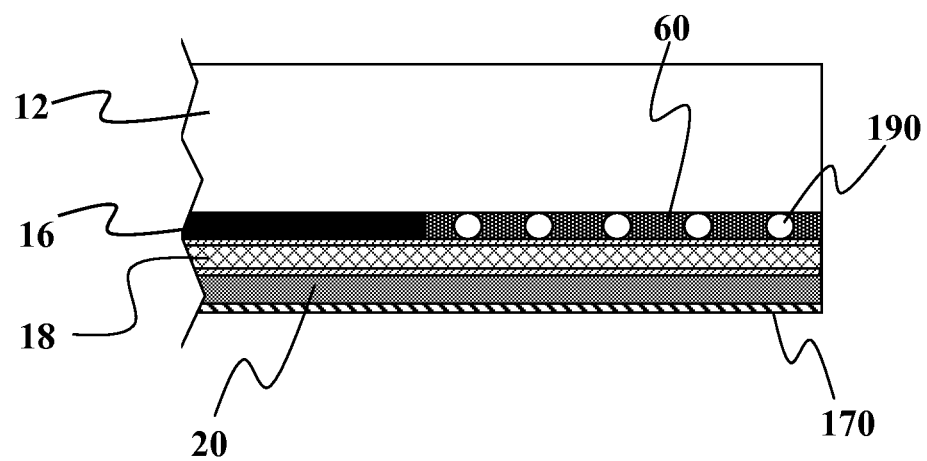

Referring now to FIG. 12, a still further embodiment is shown wherein the hard spacer layer 18 extends beneath the moisture barrier 60. The spacers 190 may be adjusted in size to accommodate the hard spacer layer 18. Again, in this embodiment, the cells 16 may be in direct contact with the layer 12. The spacer beads 190 in the moisture barrier 60 may also be reduced in size as appropriate to accommodate the increased thickness form hard spacer layer 18 underneath the moisture barrier 60.

Figure 13:
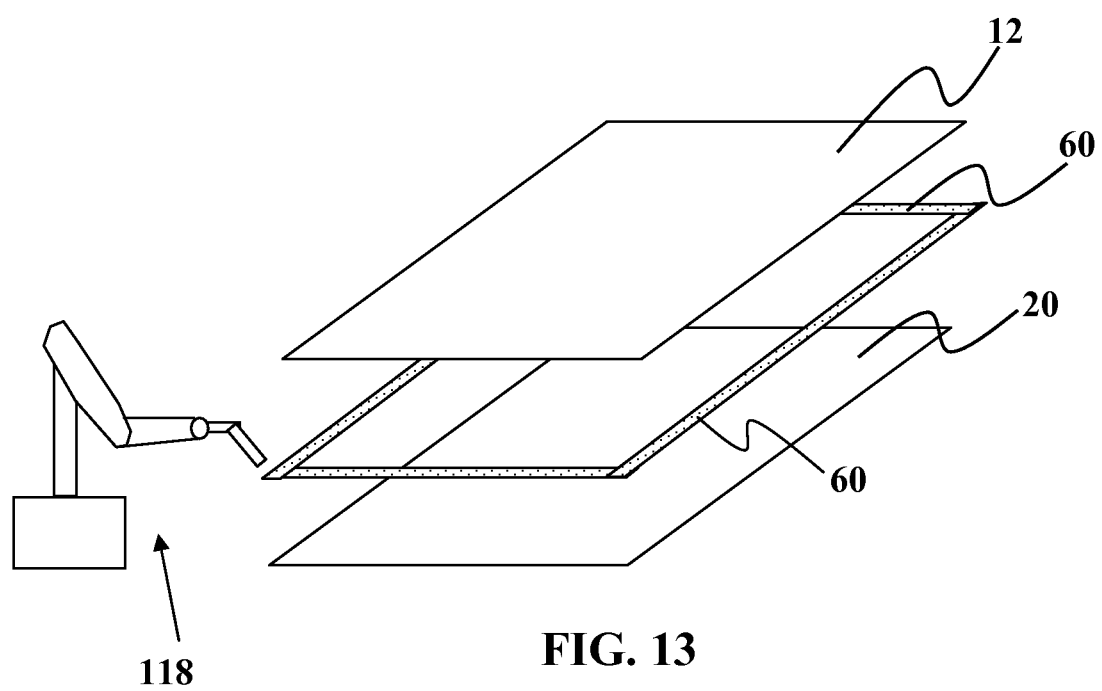
FIG. 13 shows one embodiment of a moisture barrier according to the present invention.

Referring to FIG. 13, a simplified perspective view is shown of one embodiment of the invention. For ease of illustration, the embodiment of FIG. 13 is shown without the cells 16 and pottant layers 14 and 18. FIG. 13 shows that the moisture barrier 60 may be positioned along the perimeter of the module layers and may be loaded with spacers 90 therein. In this embodiment, the particles 90 are distributed in a substantially uniform manner in the barrier 60. The moisture barrier 60 may be a preformed tape applied to the module layer or it may be in molten form and extruded by a robotic device 118 directly onto the target surface.

Alternative Embodiments

Figure 14:
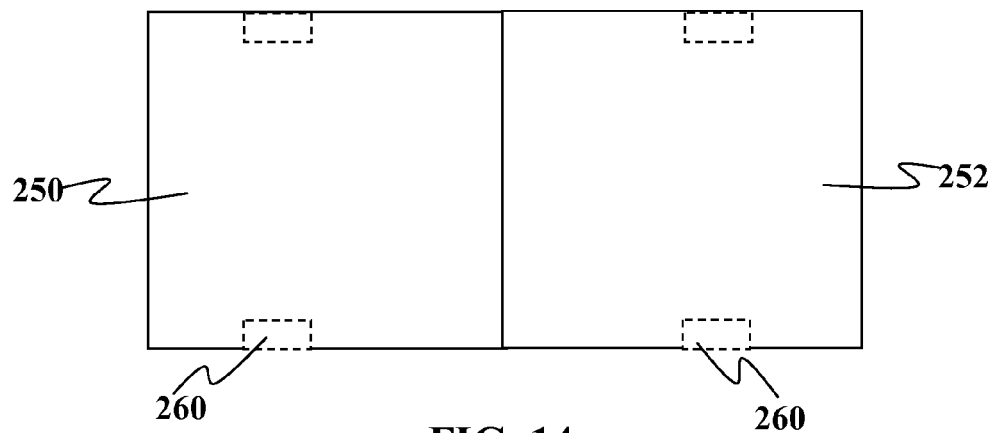
FIGS. 14 through 16 show various embodiments of the present invention.
Figure 15:
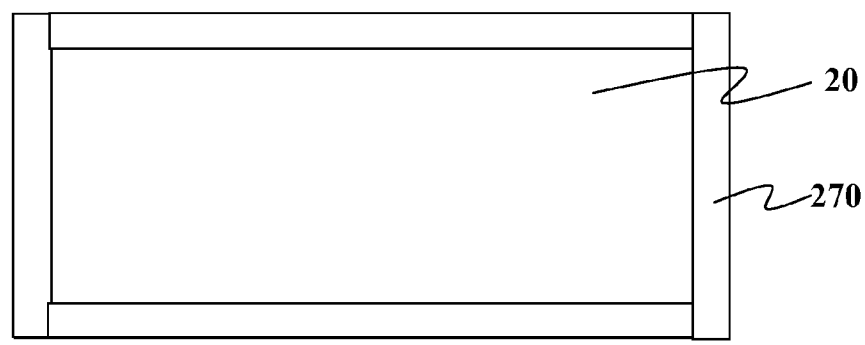

Referring to FIGS. 14 and 15, some alternative embodiments for the back layer 20 will now be described. FIG. 14 shows that in some embodiments, the module back layer 20 may be comprised of two separate pieces of foil 250 and 252. This may arise in certain situations where the module is of significant size and the foils are more easily attached in smaller sheets. In some embodiments, foils of different thicknesses, material qualities or materials may be used. Some may have additional foil or non-foil material placed at strategic locations such as but not limited to locations 260 (shown in phantom) where mounting devices are attached to module. Optionally, as seen in FIG. 15, either different foils may be used along the perimeter layer 270 or it may be additional material layered over a module back layer 20. Perimeter layer 270 may be a foil material similar to that used for module back layer 20 or it may be a different material. In this manner, the perimeter layer 270 may provide increased strength or toughness in areas with there may be more mechanical wear or stress. Optionally, the layer 270 may have increased electrical insulating properties, greater than that of the module layer 20.

Figure 16:
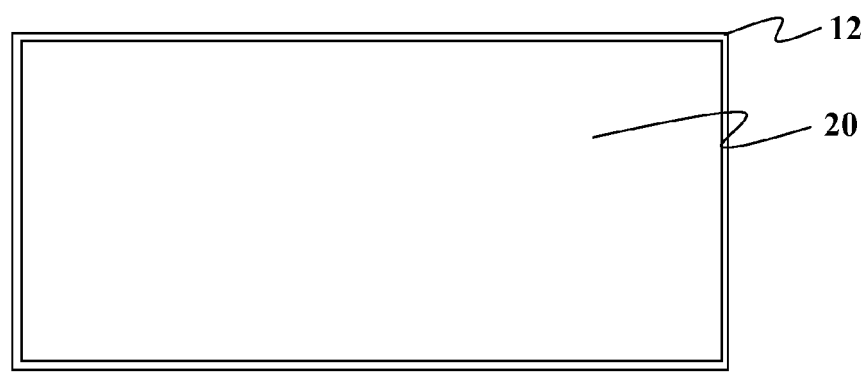

FIG. 16 shows that in some embodiments, the module back layer 20 may be sized to be smaller than module front layer 12. This may allow for a different material to be place around the perimeter or for the perimeter to be left bare which may be advantageous as it reduced contact on the layer 20 and reduces mechanical wear or strain on the material used for module back layer 20.

Module Interconnection

Referring now to FIG. 17, some embodiments of the modules used with the above assemblies will be described in further detail. FIG. 17 shows one embodiment of the module 302 with a plurality of solar cells 360 mounted therein. In one embodiment, the cells 360 are serially mounted inside the module packaging. In other embodiments, strings of cells 360 may be connected in series connections with other cells in that string, while string-to-string connections may be in parallel. FIG. 17 shows an embodiment of module 302 with 96 solar cells 360 mounted therein. The solar cells 360 may be of various sizes. In this present embodiment, the cells 360 are about 135.0 mm by about 81.8 mm. As for the module itself, the outer dimensions may range from about 1660 mm to about 1666 mm by about 700 mm to about 706 mm. Optionally, the module dimensions may be in the range of about 1640 mm to about 1680 mm range while the width can be about 700 mm to about 870 mm. Optionally, the active area dimensions may range from about 1660 mm to about 1665.7 by about 700 mm to about 705.71 mm. Optionally, the module may have outer dimensions in the range of about 1 m by about 2 m. Optionally, the module may have dimensions of the active area in the range of about 1 m by about 2 m.

FIG. 18 shows yet another embodiment of module 304 wherein a plurality of solar cells 370 are mounted there. Again, the cells 370 may all be serially coupled inside the module packaging. Alternatively, strings of cells may be connected in series connections with other cells in that string, while string-to-string connections may be in parallel. FIG. 18 shows an embodiment of module 302 with 48 solar cells 370 mounted therein. The cells 370 in the module 304 are of larger dimensions. Having fewer cells of larger dimension may reduce the amount of space used in the module 302 that would otherwise be allocated for spacing between solar cells. The cells 370 in the present embodiment have dimensions of about 135 mm by about 164 mm. Again for the module itself, the outer dimensions may range from about 1660 mm to about 1666 mm by about 700 mm to about 706 mm. Optionally, the module dimensions may be in the range of about 1640 mm to about 1680 mm range while the width can be about 700 mm to about 870 mm.

The ability of the cells 360 and 370 to be sized to fit into the modules 302 or 304 is in part due to the ability to customize the sizes of the cells. In one embodiment, the cells in the present invention may be non-silicon based cells such as but not limited to thin-film solar cells that may be sized as desired while still providing a certain total output. For example, the module 302 of the present size may still provide at least 100 W of power at AM1.5G exposure. Optionally, the module 302 may also provide at least 5 amp of current and at least 21 volts of voltage at AM1.5G exposure. Details of some suitable cells can be found in U.S. patent application Ser. No. 11/362,266 filed Feb. 23, 2006, and Ser. No. 11/207,157 filed Aug. 16, 2005, both of which are fully incorporated herein by reference for all purposes. In one embodiment, cells 370 weigh less than 16 grams and cells 360 weigh less than 8 grams. Total module weight may be less than about 11 kg. Total module weight may be less than about 12 kg. Total module weight may be less than about 13 kg. Total module weight may be less than about 14 kg. In another embodiment, the module weight may be less than about 15 kg. In yet another embodiment, the module weight may be less than about 16 kg. Further details of suitable modules may be found in commonly assigned, co-pending U.S. patent application Ser. No. 11/537,657 filed Oct. 1, 2006, fully incorporated herein by reference for all purposes. Mount clips 393 may also be included with each module to attach the module to support rails. As seen, some embodiments of the clips 393 may have extended lengths to more evenly distribute the load from clamping the module to the ground supports. The length of the clips may be greater than about 8 inches. In some embodiments, the clips are longer than about 10 inches. In other embodiments, the clips are longer than about 12 inches. In other embodiments, the clips are longer than about 14 inches. In other embodiments, the clips are longer than about 16 inches. In other embodiments, the clips are longer than about 18 inches. In other embodiments, the clips are longer than about 20 inches. In other embodiments, the clips are longer than about 22 inches. In other embodiments, the clips are longer than about 24 inches. They may be designed not to cover or shadow any underlying solar cells.

Although not limited to the following, the modules of FIGS. 17 and/or 18 may also include other features besides the variations in cell size. For example, the modules may be configured for a landscape orientation and may have connectors 380 that extend from two separate exit locations, each of the locations located near the edge of each module. In one embodiment, that may charged as two opposing exit connectors on opposite corners or edges of the module in landscape mode, without the use of additional cabling as is common in traditional modules and systems. Optionally, each of the modules 302 may also include a border 390 around all of the cells to provide spacing for weatherproof striping and moisture barrier.

Edge Exiting Module Connector

Referring still to FIGS. 17 and 18, it should be understood materials cost may also be reduced by eliminating the traditional central junction box found in most conventional modules. As seen in FIG. 17, instead of having all wires and electrical connectors extending out of a single central junction box that is typically located near the center of the module, wires and ribbons from the module 302 may now extend outward from along the edges of the module, closest to adjacent modules. The solar cells in module 302 are shown wherein first and last cells are electrically connected to cells in adjacent modules. Because the leads may exit the module close to the adjacent module without having to be routed to a central junction box, this substantially shortens the length of wire or ribbon need to connect one module to the other. The length of a connector 380 may be in the range of about 5 mm to about 500 mm, about 5 mm to about 250 mm, about 10 mm to about 200 mm or no more than 3× the distance between the closest edges of adjacent modules. Some embodiments have wire or ribbon lengths no more than about 2× the distance between the edges of adjacent modules. Some embodiments have wire or ribbon lengths no more than about 2× the distance between a junction box or edge housing on module and a junction box or edge housing on another module. These short distance wires or ribbons may substantially decrease the cost of having many modules coupled together in close proximity, as would be the case at electrical utility installations designed for solar-based power generation By way of nonlimiting example, the connector 380 may comprise of copper, aluminum, copper alloys, aluminum alloys, tin, tin-silver, tin-lead, solder material, nickel, gold, silver, noble metals, or combinations thereof. These materials may also be present as coatings to provide improved electrical contact. Although not limited to the following, in one embodiment, a tool may use a soldering technique to join the electrical leads together at the installation site. Optionally, in other embodiments, techniques such as welding, spot welding, reflow soldering, ultrasonic welding, arc welding, cold welding, laser welding, induction welding, or combinations thereof may be used. Soldering may involve using solder paste and/or solder wire with built-in flux.

Figure 17A:
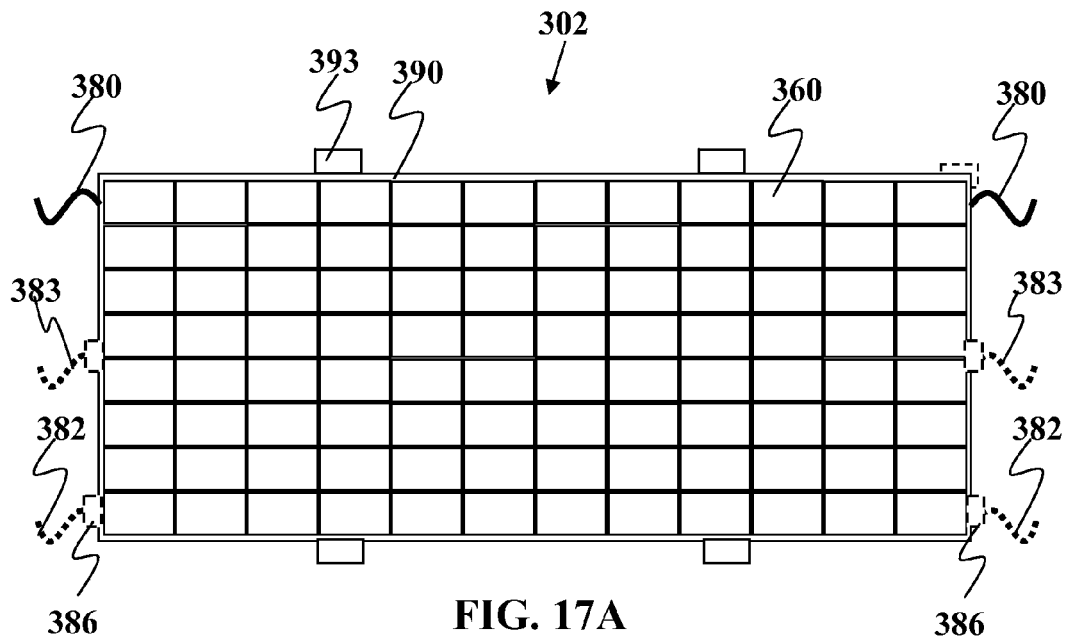
FIGS. 17 and 18 show top-down views of modules according to various embodiments of the present invention.

As seen in FIG. 17A, some embodiments may locate the connectors 382 (shown in phantom) at a different location on the short dimension end of the module 302. Optionally, an edge connector 306 (shown in phantom) may also be used with either connectors 380 or 382 to secure the connectors to module 302 and to provide a more robust moisture barrier. Optionally, as seen in FIG. 17, some embodiments may have the connector 383 extending closer to the mid-line of the short dimension end of the module.

Figure 17B:
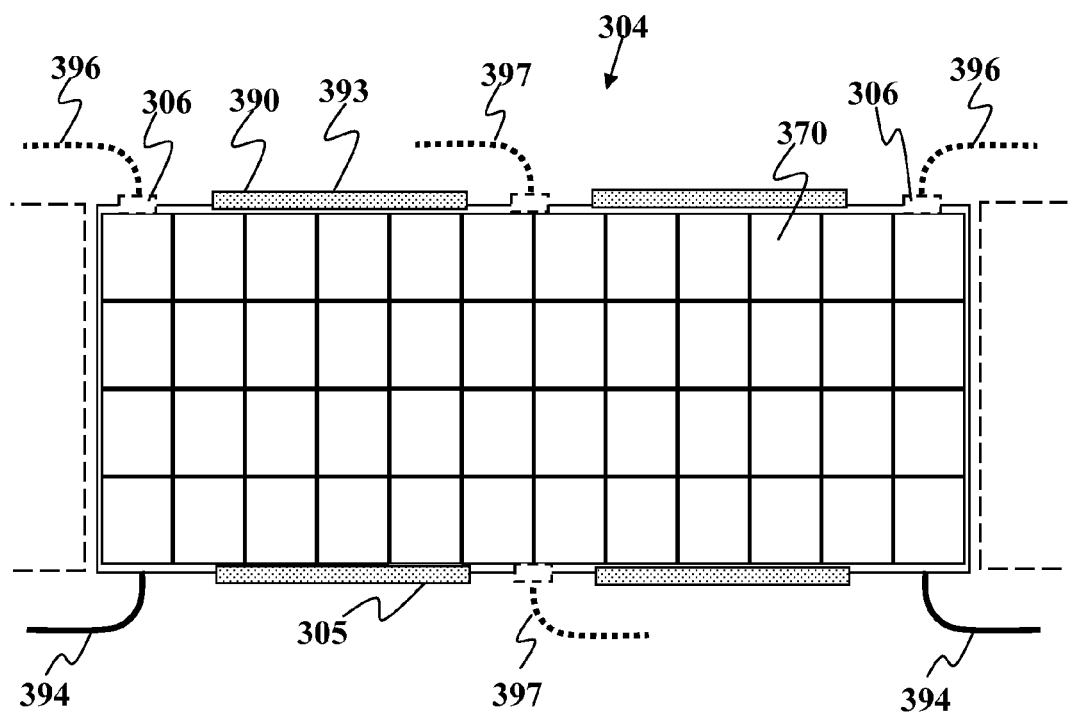

FIG. 17B shows one variation on where the connectors exit the module 304. The connectors 394 are shown to exit the module 304 along the side 305 of the module with the long dimension. However, the exits on this long dimension end are located close to ends of the module with the short dimensions, away from the centerpoint of the module. This location of the exit on the long dimension may allow for closer end-to-end horizontal spacing of modules with the ends of adjacent modules 395 and 396 (shown in phantom) while still allowing sufficient clearance for the connectors 394 without excessive bending or pinching of wire therein. As seen in FIG. 17B, other embodiments of the present invention may have connectors 396 (shown in phantom) which are located on the other long dimension side of the module 304. Optionally, some embodiments may have one connector on one long dimension and another connector on the other long dimension side of the module (i.e. kitty corner configuration). In still further embodiments, a connector 397 may optionally be used on the long dimension of the module, closer to the midline of that side of the module. As seen in FIG. 17B, edge connectors 306 (shown in phantom) may also be used with any of the connectors shown on module 304.

Figure 18A:
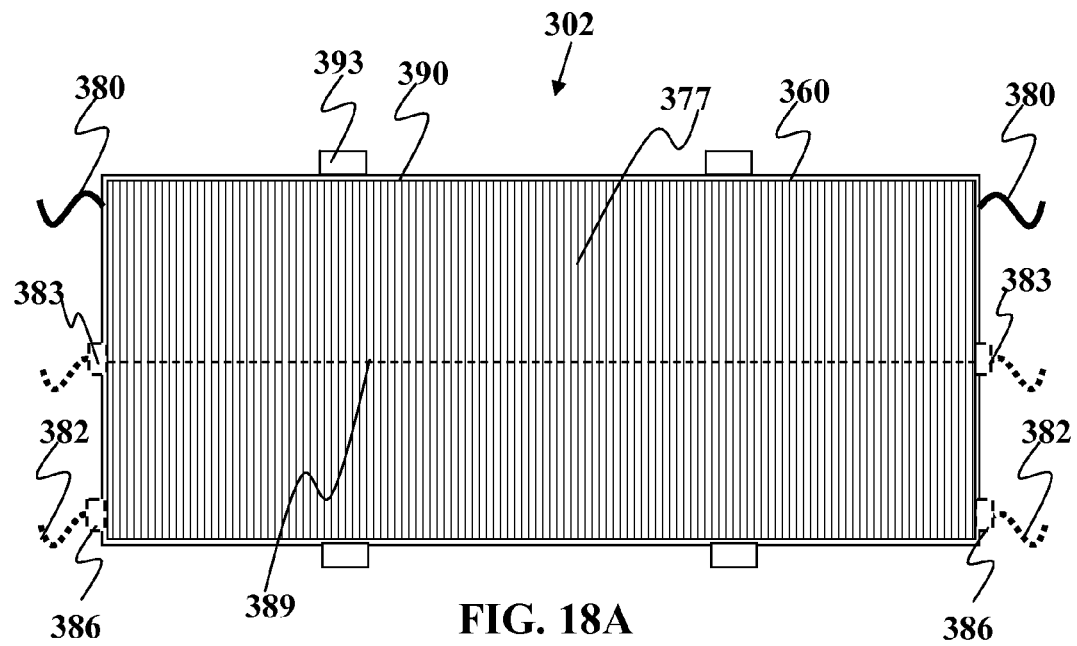
Figure 18B:
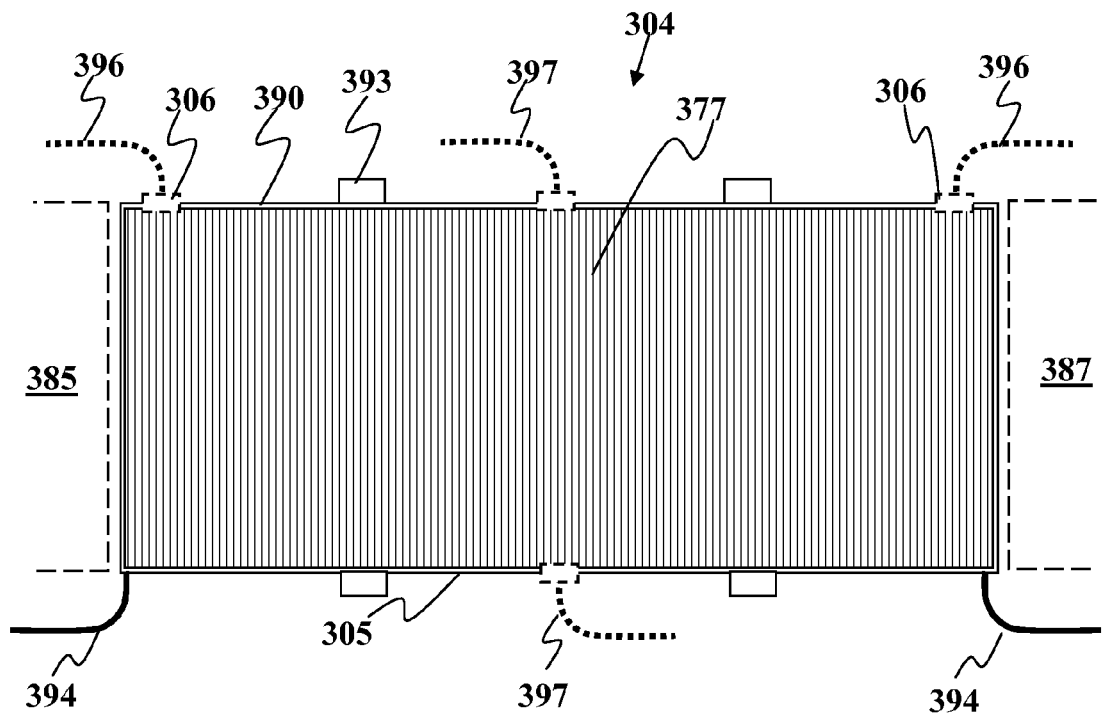

Referring now to FIGS. 18A and 18B, it is shown that the connectors of FIGS. 8 and 9 may be adapted for use with solar cells 377 of other configurations. In this embodiment, the cells 377 extend substantially across the width of the module (between the moisture barrier, if there is one) along the shorter length of the module. Cells 398 of FIGS. 17A and 17B extend across the width of the module (between the moisture barrier, if there is one) along the longer length of the module. FIG. 18A shows that in one embodiment, elongate cells 377 may be strung together by one or more centerline connector (s) positioned along the midline 389. The edge housings 383 are used. By way of example and not limitation, typically only one set of edge housings are used such as two edge housing 383, two edge housings 386, one edge housing 383 with one edge housing 386, etc . . . . It should be understood that in any of these embodiments, the edge housing may be completely on the backside of the module and does not extend beyond the glass perimeter. Optionally, other embodiments may have then extend beyond the glass perimeter.

FIG. 18B also shows that in some embodiments, the edge housing 306 may be positioned not to be exactly at the position next to the last cell. FIG. 11B shows that the housing 306 remains close the last cell but positioned to be spaced apart from it.

As seen in FIG. 17B, the corners of the module are protected by a protective corner assembly 398 which may be mounted on one, two, or all corners of the module. The corner assembly 398 may comprise of a housing that covers the seals at the corner. Optionally, the corner assembly 398 may be filled with air or pottant to provide a protective barrier. The assembly 398 may be a plastic corner made with low or moderate WVTR plastic or attractive-appearance plastic affixed to the module corner with strong, durable, (possibly also low or moderate WVTR) adhesive. In some embodiments, the corner assembly 398 may be incorporated and/or integrally formed with the edge connector to provide corner protection. Of course, the optional corner protections on the module might be used for moisture sensitive solar cells or for attractive appearance. In place of or in conjunction with the assembly 398, corner protections can be comprised of 1) aluminum-aluminum welded seam or 2) overlapping aluminum layers with strong, durable adhesive.

Figure 19A:
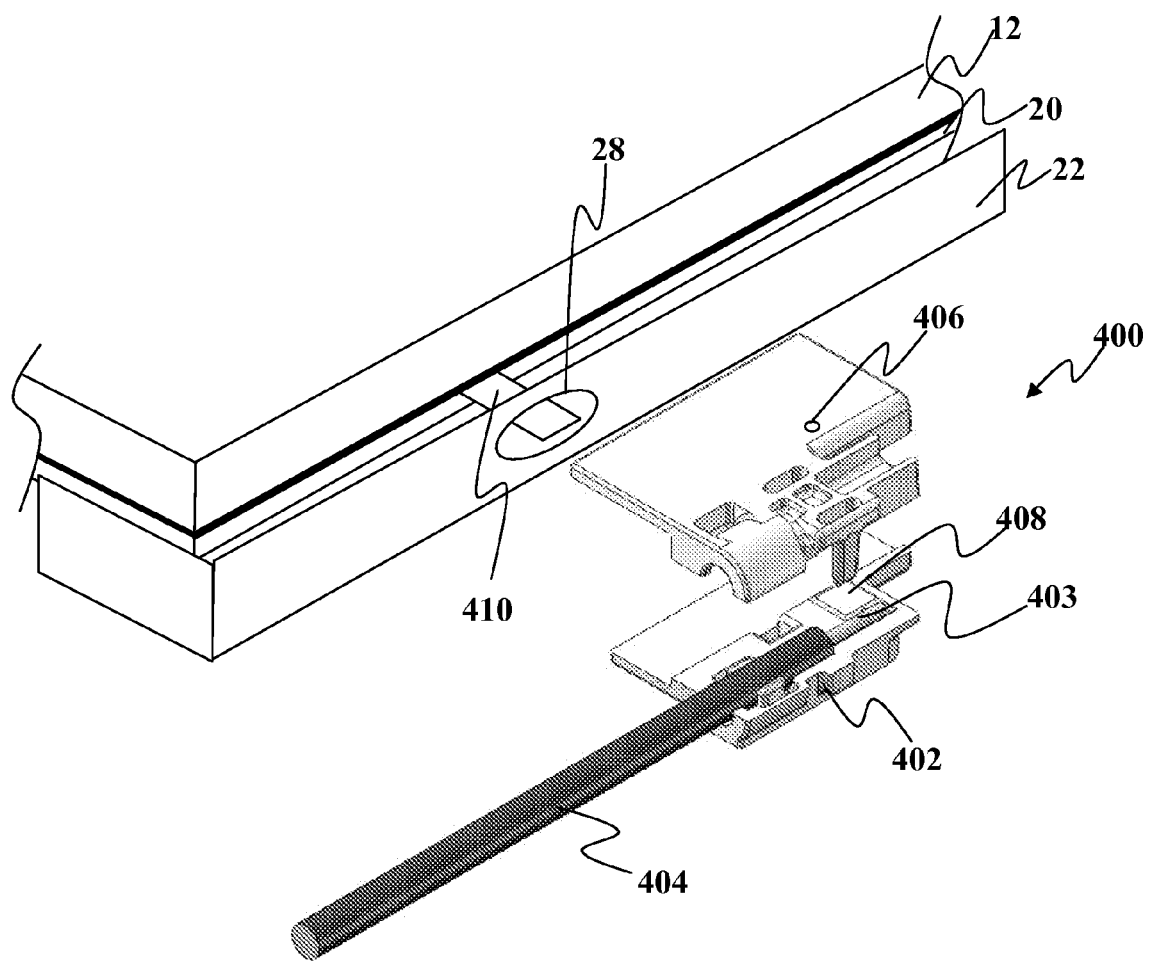
FIG. 19A-19D show various view of edge connector according to embodiments of the present invention.

Referring now to FIG. 19A, a more detailed description of one embodiment of an edge connector 400 will now be described. Although the ribbons 40 and 42 may exit from various locations on the module 10, the present embodiment has the ribbons 40 and 42 exiting from along the edges of the module. An opening 28 may be provided in foil portion 22 to allow for the ribbons 40 and 42 to exit. The use of an edge connector 400 enables the electrical connection of one electrical conductor to another at the edge of a multilayer flat panel or module while providing electrical, environmental, and mechanical protection to both cables. The connector 400 wraps around the edge of the solar module 10 at the location of the electrical lead exit and is bonded to the module layers at all points surrounding the conductor exit, providing an environmental seal, and mechanical support for the edge connector 400. In the present embodiment, the edge connector 400 includes an upper half 401 and a lower half 402. The edge connector 400 may optionally have a set screw or other means of providing mechanical pressure to electrically connect the two bare conductors within the module. The second conductor 403 is mechanically connected to the edge connector by means of a compression fitting or adhesive. The second conductor 403 may be a round wire with an insulating layer 404. Entry and exit holes 406 for the injection of a potting or encapsulating material exist in the module, providing an environmental seal to the conductor junction. The connector 400 may define a cavity 408 for receiving the electrical lead 410 and to provide room for encapsulating material.

Using the edge as an exit area for the electrical lead in a solar module provides several cost advantages due to not requiring any holes to be cut in the glass or potting material. However, in this method the edge sealant for the module is breached by the conductor which makes environmentally sealing the edge of the panel difficult. The present embodiment of the invention provides an insulated electrical joint and mechanical strain relief for the second cable leading away from the edge connector. This advantageously allows for the transition of a flat wire to round wire. In addition to providing a method for sealing and securing an edge exiting flat conductor, the present embodiment of the invention provides a housing that is easy to assembly in an automated many by providing locating and retaining features for the two conductors involved in the connection.

Figure 19B:
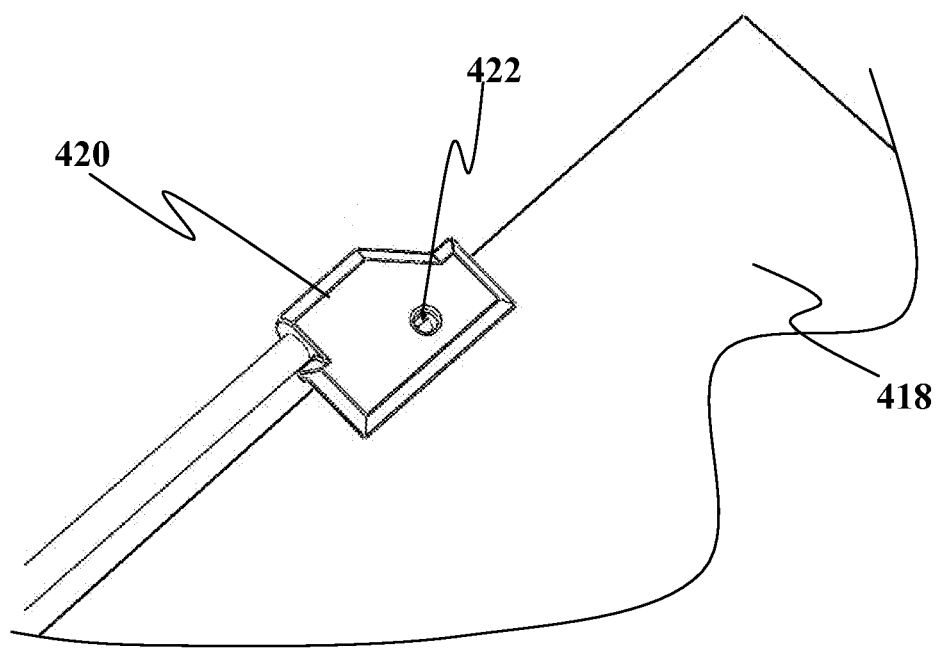

Referring now to FIG. 19B, yet another embodiment of the edge connector 420 will be described. This connector is coupled to the edge of the module and may be single piece device as more clearly seen in FIG. 19C. An opening 422 may be provided on the edge connector 420 to allow for infusion of pottant or adhesive into the connector. The opening 422 may also allow for soldering or welding of electrical leads that are housed inside the connector 420.

Figure 19C:
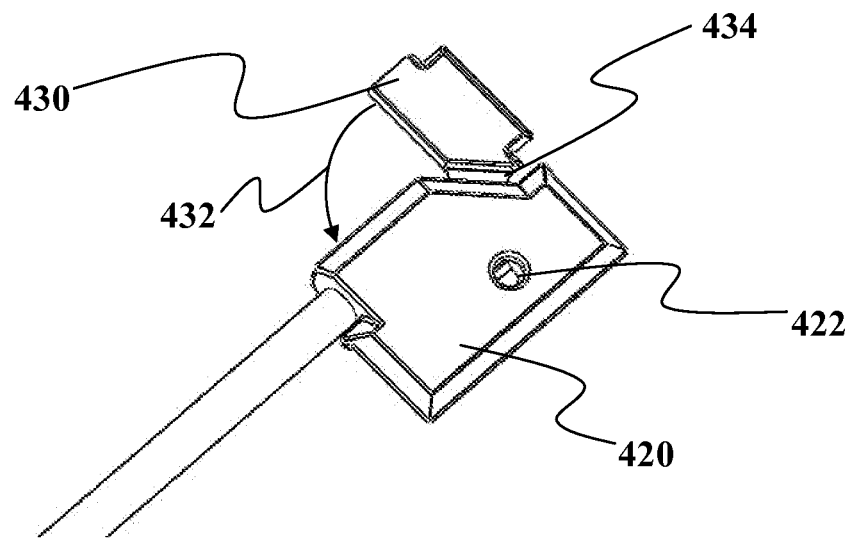

FIG. 19C shows how the edge connector 420 can be formed as a single piece unit with a flap portion 430 that can be folded over to clamp against an opposing surface of the connector 420. Arrow 432 shows how the opposing portion 430 may be folded about the hinge 434 to clamp against the other surface of the connector 420 in a clam-shell fashion.

Figure 19D:
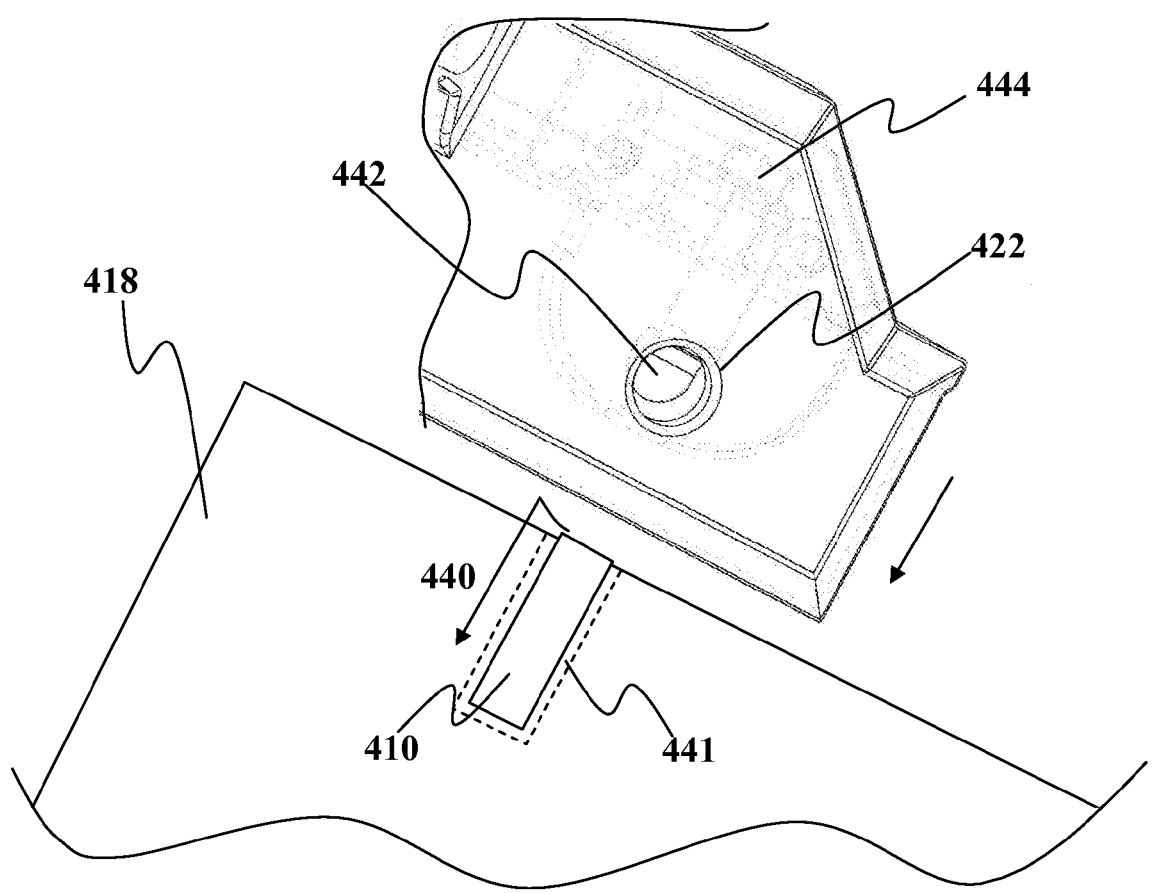

FIG. 19D show a close-up view of edge connector 420. The connector 420 may slide over the module 418 and overlap the electrical lead 410. In this embodiment, the electrical 410 may extend out the edge and is then wrapped over a planar surface of the module 418. This folded configuration is indicated by arrow 440. An electrically insulating material 441 may optionally be used to separate the electrical lead or wire 410 from any metal foil of the module backside. This material may be glass, butyl rubber, polymer, other moisture barrier electrically insulating material, or the like. The electrical lead may then be in contact with metal tab 442 inside the edge connector 420. In the present embodiment, the tab 422 (partially shown in phantom) extends inside the connector 420 to coupled to a wire leading outside the connector to connect to another module. The tab 422 maybe curved at a opposite end 444 to connect with the wire. The opening 422 allows the metal tab 442 to be soldered, welded, or otherwise electrically coupled to the electrical lead 410 coming from the module. The connection between the electrical lead 410 and the tab 442 may be made before or after the edge connector is placed on the module. It should be understood than the edge connector 420 may also be adapted for use with glass-glass type modules as set forth in U.S. Patent Application Ser. No. 60/862,979 filed Oct. 25, 2006.

Back Side Exiting Connector

Figure 20:
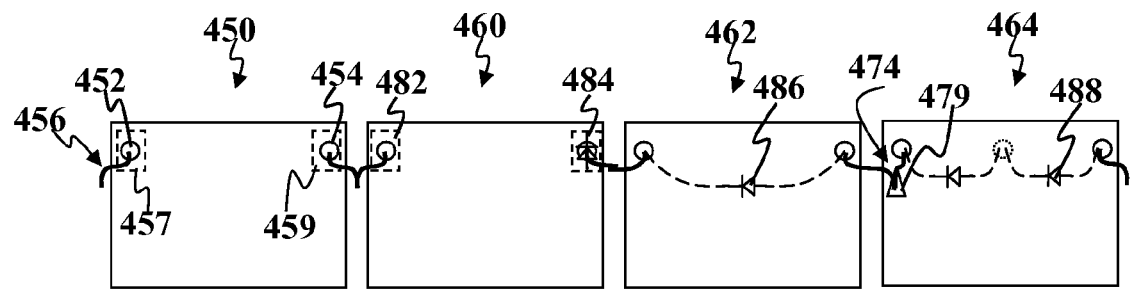
FIGS. 20 and 21 show back-side exiting electrical connectors according to various embodiments of the present invention.

Referring now to FIG. 20, it should be understood that the electrical connectors exiting module are not limited to only exiting between the module layers. As seen in FIG. 20, wires and electrical ribbons from the module 400 may now extend outward from openings 402 and 404 on the backside of the module near the edges of the module, closest to adjacent modules. The solar cells in module 400 are shown in phantom to show that the openings 402 and 404 are near the first and last cells electrically connected in the module. This substantially shortens the length of wire or ribbon need to connect one module to the other. The length of a connector 406 may be in the range of about 5 mm to about 500 mm, about 5 mm to about 250 mm, about 10 mm to about 200 mm or no more than 3× the distance between the closest edges of adjacent modules. Some embodiments have wire or ribbon lengths no more than about 2× the distance between the edges of adjacent modules. These short distance wires or ribbons may substantially decrease the cost of having many modules coupled together in close proximity, as would be the case at electrical utility installations designed for solar-based power generation.

As seen in FIG. 20, the modules 400, 410, 412, and 414 may be series interconnected. This allows the power between modules to be added together in a manner typically preferred by most utilities running large scale solar module installations. Although not limited to the following, the modules 410, 412, and 414 typically include a plurality of solar cells and these are not shown for ease of illustration. Many more modules than those shown in FIG. 17 may be series interconnected in a repeating fashion similar to that in FIG. 20 to link large numbers of modules together. It should be understood that many number of modules (10 s, 100 s, 1000 s, etc . . . ) may be coupled together in this manner. The end module may optionally be coupled to an inverter or other appropriate electrical device.

In some embodiments, to facilitate the connection, the cell in the module may be a dummy cell 482 (FIG. 20) e.g. with an optional flat bypass diode 484 to allow for easy connection of the ribbon 458. The flat bypass diode 484 may take the place of one of the cells in the module or it may be mounted on the backsheet beneath and/or outside the module. Some other embodiments may use an external in-line diode 486 between the ribbons to handle any issues of partial shading. FIG. 20 also shows an embodiment where one or more diodes 488 may optionally be used with one module. Optionally, in some embodiments, a junction box, edge box, or other housing 457 and 459 may be positioned over the opening where an electrical connector or ribbon exits through the back and/or side edge of the module. Again, the electrical connector may be electrically insulated from the metal foil back side of the module using a variety of insulating techniques such as but not limited to glass, polymer, or other insulating material at least partially or fully surrounding the wire, electrical connector, or ribbon.

Figure 21:
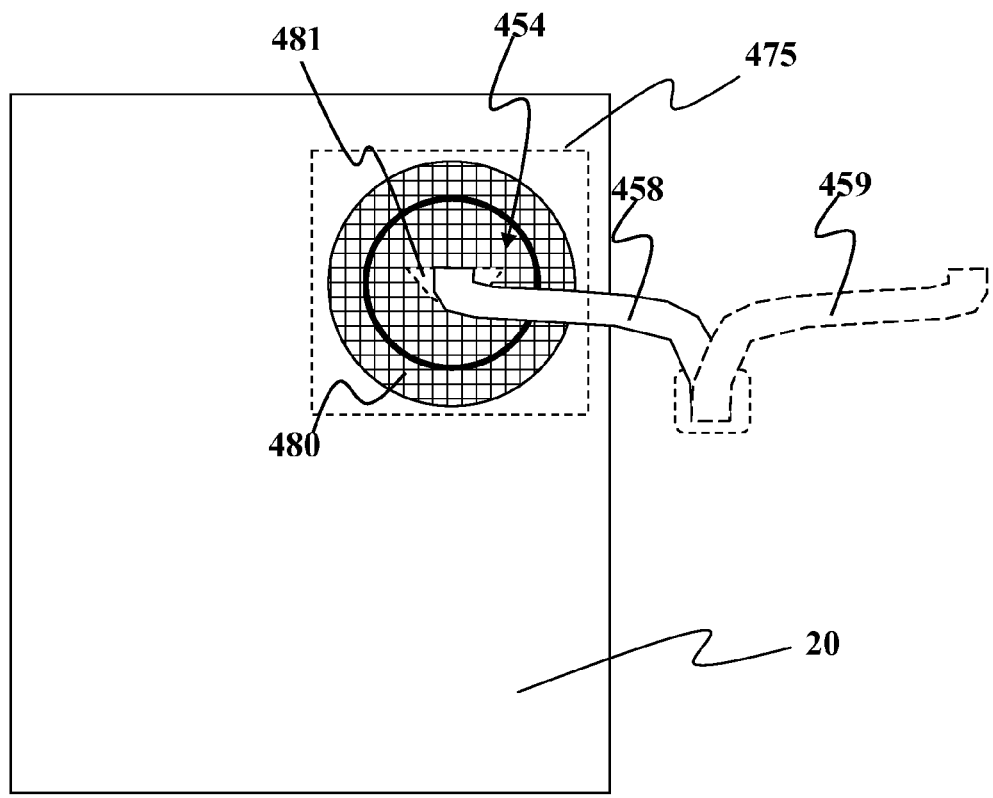

FIG. 21 shows a close-up view of module 400 with the opening 404 having a ribbon 408 extending outward from it. A ribbon 409 from an adjacent module is shown in phantom. By way of nonlimiting example, the ribbons may comprise of copper, aluminum, copper alloys, aluminum alloys, tin, tin-silver, tin-lead, solder material, nickel, gold, silver, noble metals, or combinations thereof. These materials may also be present as coatings to provide improved electrical contact.

FIG. 21 shows that the opening may sealed by a large area of sealant 480 that covers the opening 454 and creates a protective barrier for the opening. The sealant 480 may form a circular patch or it may be a square patch, oval patch, or other shaped patch. This creates a substantially flat backside connector that may allow for flat packing during transport of the modules. Optionally, additional strain relief 481 may be provided at the exit point of the ribbon from the module. The wire or ribbons passing through opening 454 contacts an aluminum patch right through to the back of an ending solar cell. The sealant 480 patches over the opening 454 in a manner so that there are some inches of contact and thus a humidity barrier. To maintain the high voltage withstand, the separation between the electrical lead exiting the opening 454 and the back layer 20 sized to prevent electrical shorting arcing that may occur. For air filled devices, 2 mm space is desired for 600V rating, 10 mm spacing for 4000 V rating. For other filling insulations, the spacing can be left the same or reduced to as little as 1/10 the spacing, depending on the uniformity of manufacturing process to fill and adhere the insulation. It should be understood that a housing 475 (shown in phantom) may also be placed over the exit. This housing 475 may be air filled, encapsulant filled, or electrical insulation filled to maintain the desired high voltage withstand.

In some embodiments, to facilitate the connection, the cell in the module may be a dummy cell 482 (FIG. 20) e.g. with an optional flat bypass diode 484 to allow for easy connection of the ribbon 458. The flat bypass diode 484 may take the place of one of the cells in the module or it may be mounted on the backsheet beneath and/or outside the module. Some other embodiments may use an external in-line diode 486 between the ribbons to handle any issues of partial shading. FIG. 20 also shows an embodiment where one or more diodes 488 may optionally be used with one module.

Although the embodiment shown herein mostly have wire or ribbons exiting near the edges of the module, it should understood that some variations may also use exits located near the center, away from adjacent modules. The modules may optionally include junction boxes. Even though these modules may optionally include a junction box, they may still advantageously use the simplified connector system described in FIG. 20 where the ends may be soldered or otherwise joined without using a more costly press-fit connector.

Photovoltaic Power Installation

Figure 22A:
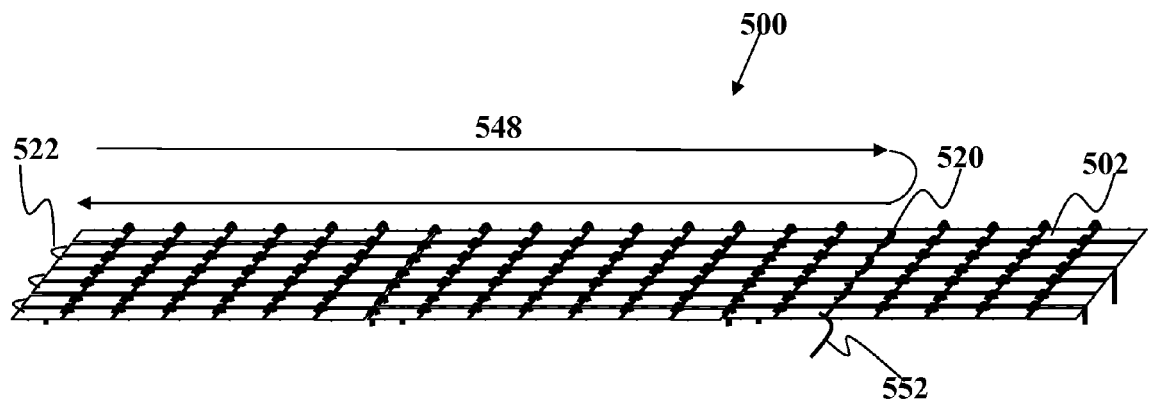
FIGS. 22A and 22B show various photovoltaic installations according to embodiments of the present invention.
Figure 22B:
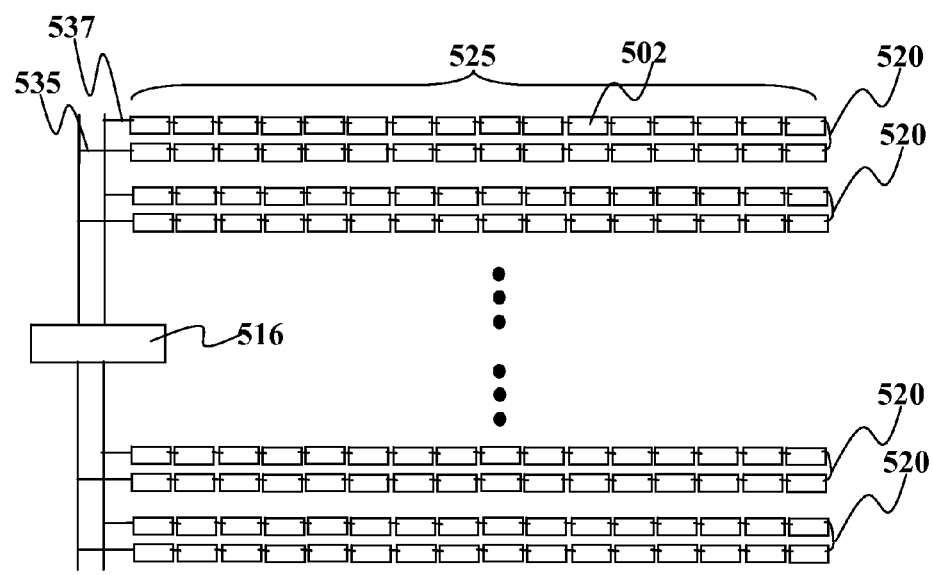

Referring now to FIGS. 22A and 22B, it should be understood that embodiments of the modules shown herein may be used in various situations including large scale power installations and are limited to installations of any particular size. FIG. 22A shows one embodiment of a large scale photovoltaic power installation 500. A plurality of modules are mounted on an angled support. Details on the mounting assembly are found in copending U.S. patent application Ser. No. 11/538,040 filed in Oct. 2, 2006 and fully incorporated herein by reference. By way of nonlimiting example, the modules 502 may be electrically coupled in a manner so that the electrical coupling of modules 502 in a row does not necessarily match the number of physical modules 502 in a row. It should be understood that modules 502 may be any of the module configurations disclosed herein. As seen in FIG. 22A, each row may have many modules. This particular embodiment shows about 21 modules in a row. Other embodiments may have even more modules 502. In this embodiment, however, only 16 of the modules are electrically coupled together in one row. As indicated by arrow 548, the modules 502 are coupled in series and then coupled by connector 520 to 16 modules in the next adjacent row, not the modules 502 in the same row. Some rows may have as many as 112 modules in a physical row. Of course electrically, the number of the modules 502 in a row may be 16 or similar less number. A lead 552 may be used to couple the modules to an inverter or other suitable electrical device to handle power generated by the modules 502. Hence, in large scale deployments, physical rows do not necessarily represent electrical rows. Some embodiments may also have modules coupled in parallel as described in copending U.S. patent application Ser. No. 11/538,040. For ease of illustrations, connectors are shown on the topside of the module. It should be understood however, that the connectors may be along the edges and/or underside of the modules as described in the other embodiments herein.

FIG. 22B shows how modules 502 and connectors 520 can be positioned to substantially reduce the amount of wiring used to connect the modules to an inverter 516. In conventional PV systems, modules have external cables in the total length per module of at least the long side of the module, and they typically have internal wiring in the amount of at least the short side of the module (in order to bring current from internal strings back to the middle of the module where the traditional junction box is located). A conventional PV system for a row similar that of row 525 would use more than 38.2 M*(27+16*7) per row in module external/internal DC wiring or more than 1986 m in additional cabling for each 100 kW unit (which for embodiments using modules 502 is 832 modules [32*26]). The present embodiment in FIG. 22B uses only about 140 m in total system DC wiring for 832 modules compared to 3.4 km of total system DC wiring used in a conventional system. Additionally, voltage mismatch issued are avoided which arise in conventional systems due to differential resistive voltage drops over variably long DC cable form the various homerun connections of different length in conventional deployments, wherein the correction of which tends to introduce significant on-site engineering cost and overhead. FIG. 22B shows that by eliminating traditional junction boxes, using direct module-to-module interconnections/connectors at the left and right edges of each module 502, and configuring the modules to be two rows coupled in a U-configuration (and keeping row connectors at the same end for all rows), the wiring is significantly simplified. Connections to the inverter 516 from each row 525 are based on short connectors 535 and 537 which couple to wiring leading to the inverter.

To maximize the number of modules that can be delivered to these installations site, the modules may be sized in length between about 1660 mm to about 1666 mm and width of about 700 mm to about 706 mm. The modules may be framed or unframed. More details of the suitable size may be found copending U.S. patent application Ser. No. 11/538,039 filed Oct. 2, 2006 and fully incorporated herein by reference for all purposes.

Other Form Factors

Figure 23:
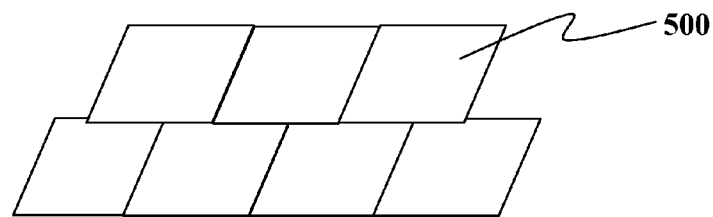
FIG. 23 shows a photovoltaic roofing tile according to one embodiment of the present invention.

As seen in FIG. 23, it should be understood that the modules herein are not limited to only traditional large rectangular forms, but may be shaped into smaller elements such as roofing tiles 550. These roofing tiles may be staggered over one another using techniques used for traditional roofing tiles. These tiles may be glass with low-cost foil back layer as described for the module 10. This use of the module as roof tile reduces the cost of integrating photovoltaic material into residential and commercial buildings. Details on some methods for overlapping tile-shaped modules can be found in copending U.S. patent application Ser. No. 11/465,783 filed Aug. 18, 2006 and fully incorporated herein by reference for all purposes.

Figure 24:
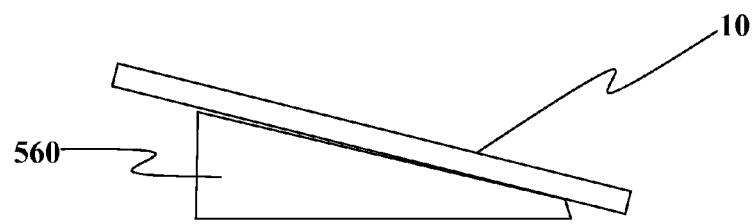
FIGS. 24 and 25 show mounting apparatus according to various embodiments of the present invention.
Figure 25:
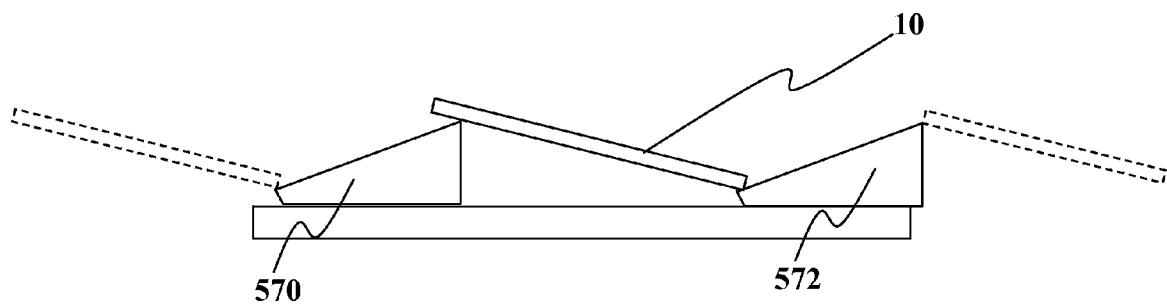

FIGS. 24 and 25 show that a variety of mounting structures may also be used with the modules described herein. FIG. 24 shows that the mounting apparatus 560 is directly beneath and supporting the module in that orientation. FIG. 25 shows that the module may be mounted over air between two supports 570 and 572. In this manner, each support 570 and 572 is coupled to more than one module 10. The modules 10 have sufficient structural strength to be mounted in this manner.

Pre-Bowing

Figure 26:
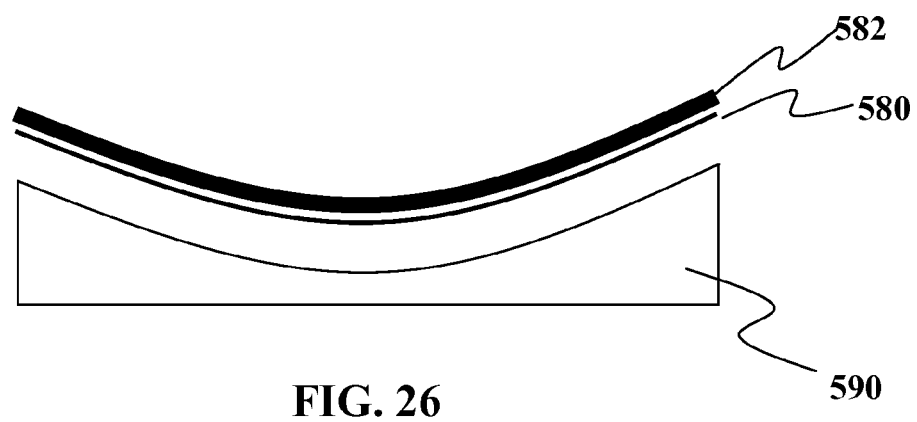
FIG. 26 shows one embodiment for pre-bowing a module according to the present invention.

Referring now to FIG. 26, one technique will now be described to address undesired module bowing that may occur during manufacturing. The technique shown in the present invention involves pre-bowing the module prior to and/or during lamination. The foil layer 580 expands more than the glass layer 582 during lamination heating, and when it cools, it also contracts more, stressing the glass and causing undesired bowing (for ease of illustration, cells and other elements between the foil layer and glass layer are not shown). In the present application, the foil layer 580 and glass layer 582 are both pre-bowed or curved in the direction opposite that which the foil layer 580 bends towards when cooled. In this manner, the cooling will return the module to a flat planar configuration from the curved pre-bowed configuration shown in FIG. 26. The pre-bowing may be achieved using a curved template 590 against which the lamination will occur. In this manner, at the highest lamination temperature, the entire module is curved. The curved template may be formed in one-piece or as multiple pieces. In one multiple piece embodiment, a plurality of sheets of material of varying sizes are stacked to create the desired curvature. This pre-bowing may also be used in other modules such as but not limited to glass-glass modules where one layer may have a different coefficient of thermal expansion or other factor which may cause bowing when the device is cooled.

Underside Edge Housing

Figure 27:
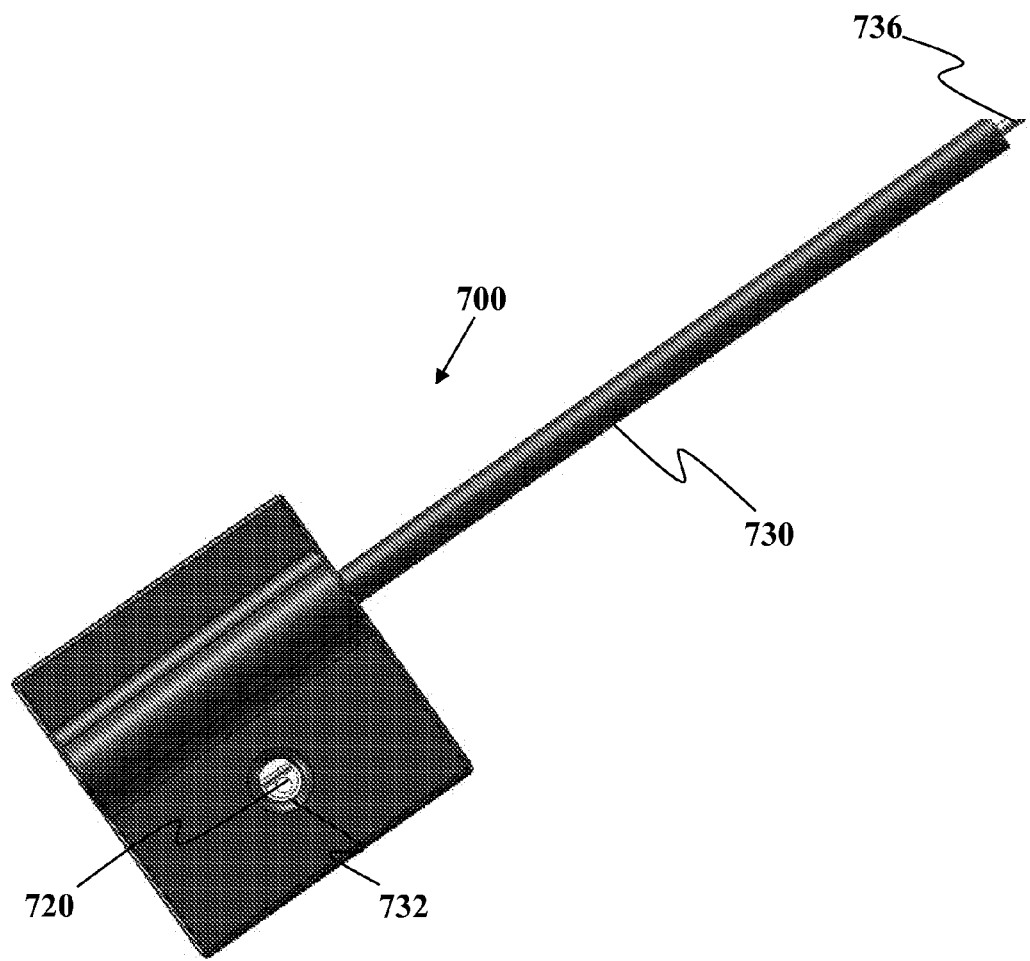
FIGS. 27 and 28 show an edge connector or housing according to one embodiment of the present invention.

FIG. 27 shows an underside view of an edge housing 700. The conductive core 736 of the wire 730 is easily visualized. This underside view also shows the opening 732 through which the metal connector 720 is visible. Although not limited to the following, the module layer in this embodiment may be flexible material such as but not limited to any of the TAP, TAPT, metal foil, or laminates described herein. This will secure the housing 700 in place and minimize moisture entry into the module. A cavity 706 may be defined within the housing 700 by the perimeter surface 702 and the lip 704. The cavity 706 may be filled with potting material, adhesive material, insulating material, and/or other material to fill the cavity 706. An opening 708 may be provided to allow air or gas to escape as the cavity 706 is filled. The cavity 706 may be filled before, during, and/or after attachment of the housing 700 to the module layer 602 or module layer 608.

FIG. 27 also shows a metal connector 720 that will electrically connect the wire 730 to an electrical lead (not shown) connected to the cells inside the module. FIG. 27 shows that the metal connector 720 may be positioned over an opening 732. The metal connector 720 may itself include an opening 734 to allow for connection to the electrical lead from the module. Although not limited to the following, the opening 734 may be used for registering detail for holding tab during insert molding of the tab and cable assembly. Optionally in other embodiments of the present invention, the opening 734 may allow for better flow of solder between the tab and strip 620 when soldering them. Although not limited to the following, the metal connector 720 extends into the interior of the edge housing 700 to reach the core portion of wire 730. In other embodiments, the metal connector 720 is merely an interface to a wire or ribbon that leads to cells inside the module. With regards to the housing or edge housing, the edge housing 700 may be comprised of two pieces formed together. Optionally the edge housing 700 may be molded or formed around the wire and metal connector 720.

Referring still to FIG. 27, this embodiment of the edge housing 700 is shown with ribs 703. These ribs may be on the underside of the edge housing 700 or on other surfaces of the housing. In one embodiment, the ribs 703 are provided to guide flow of pottant material within the edge housing 700 before, during, or after manufacturing. It should be understood that the ribs 703 may be of various shapes such as but not limited to straight, curved, or combinations thereof to provide the desired flow of pottant material. The ribs 703 may also be designed to provide structural rigidity to the edge housing 700. The ribs may be solid or they may be hollow. Some embodiments may use ribs 703 close to the opening 732 to guide the flow of pottant material that may be introduced by that opening. Ribs may also be designed to guide flow for other opening or openings used with the edge housing 700.

Figure 28:
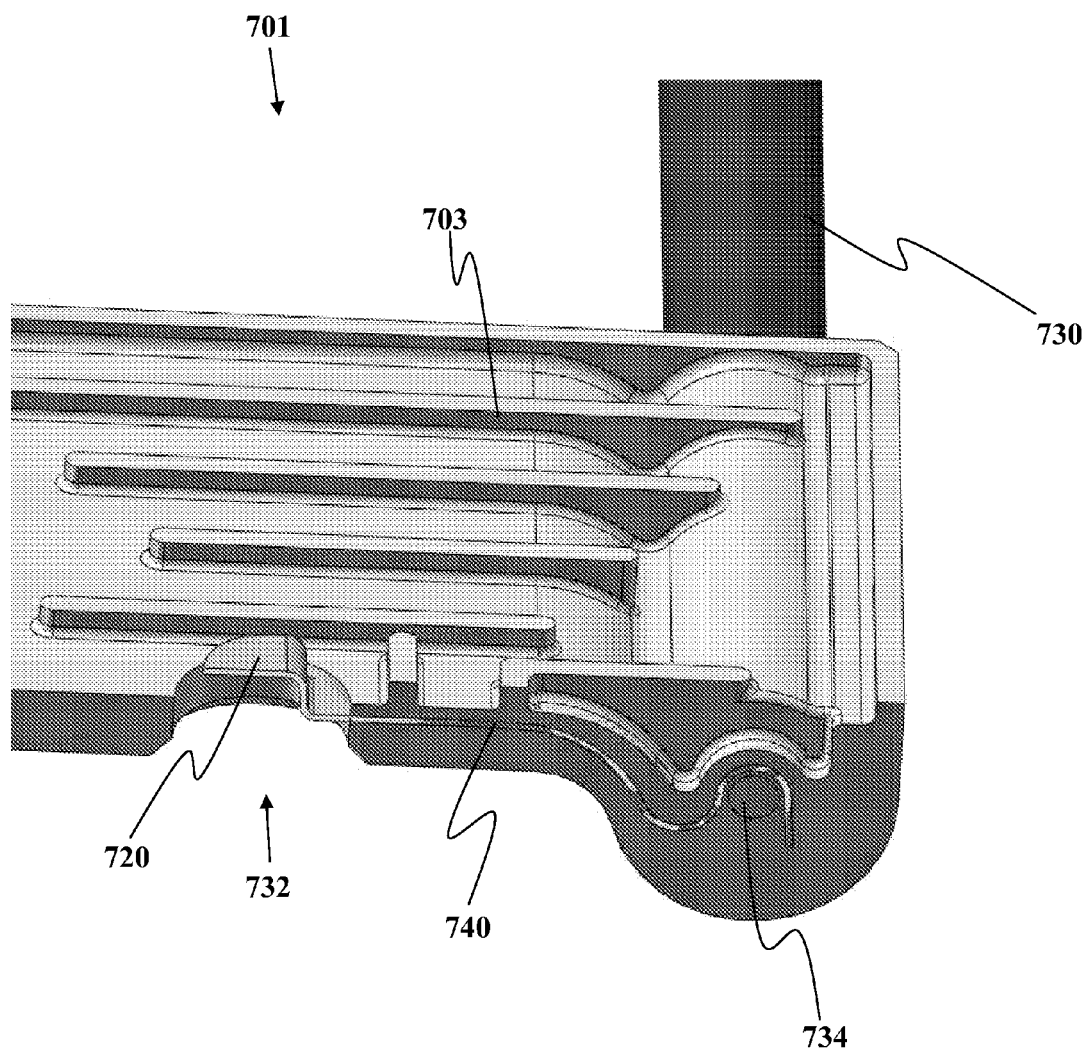

Referring now to FIG. 28, a cross-section is shown of an edge housing 701 according to one embodiment of the present invention. Edge housing 701 is substantially similar to edge housing 700, except for some variation in the support ribs in the cavity 706. This cross-sectional view shows how the metal connector 720 is connected to the core 734 of the wire 730. A channel 740 is defined in the edge housing to allow the metal connector 720 to reach the core 734. In one embodiment of the present invention, this channel 740 may be molded into the edge housing 701. Optionally, the channel 740 may be insert-molded, wherein the tab is mounted into the tool, and during molding material flows around it, encasing it. In another embodiment, the channel 740 is defined when a top portion of the edge housing 701 is brought into contact with a bottom portion of the edge housing 701. This may be via a clamshell or hinge type design. Optionally, this may include two separate pieces that are joined together to form the edge housing 701. The ribs 703 may be extend upward from the recessed surface of the housing to provide contact surfaces to allow engagement of the edge housing at location within the outer perimeter of the housing.

Shaped Module Mounts

Figure 29:
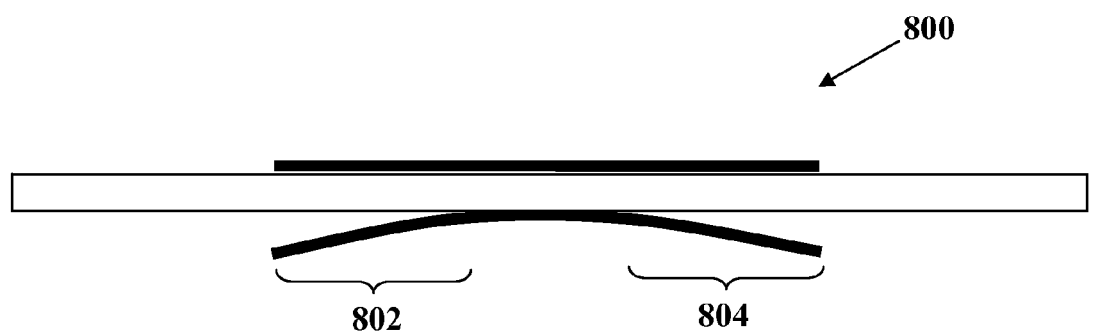
FIGS. 29 and 30 show clamps for holding the module according to embodiments of the present invention.
Figure 30:
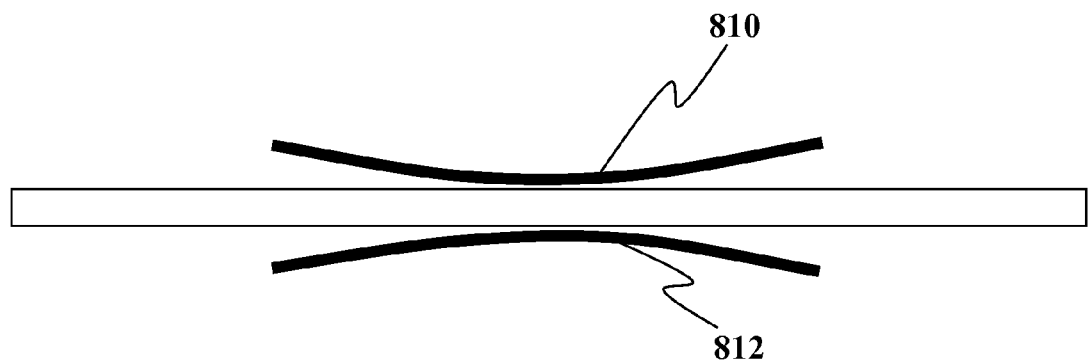

Referring now FIG. 29, one embodiment of a module clamp according to the present invention will now be described in more detail. As seen in FIG. 19, the module clamps 393 are used to secure the module to ground supports or roof mounts. Often times, the modules will be subject to mechanical loads caused by wind, hail, snow build-up, or human handling. Localized stress concentrations due to load and the interface of the module to the mount may cause more fragile layers in the module such as the glass layer(s) to crack. To minimize such localized stress concentrations, the module clamp 800 is shown with portions 802 and 804 of the clamp curved to allow for deflection of the module without creating stress concentration points. In this current embodiment, only the bottom surface of clamp 800 contains the curved surfaces. FIG. 30 shows an embodiments where both top and bottom surfaces 810 and 812 are curved. The amount of curvature varies depending on the particular application. In one embodiment, the radius of the curvature is constant or varying in the range of about 50 mm to about 500 mm, depending on the flexibility and thickness of the surface materials. In one embodiment, the radius of the curvature is constant or varying in the range of about 100 mm to about 200 mm, depending on the flexibility and thickness of the surface materials.

Service Loop

Figure 31:
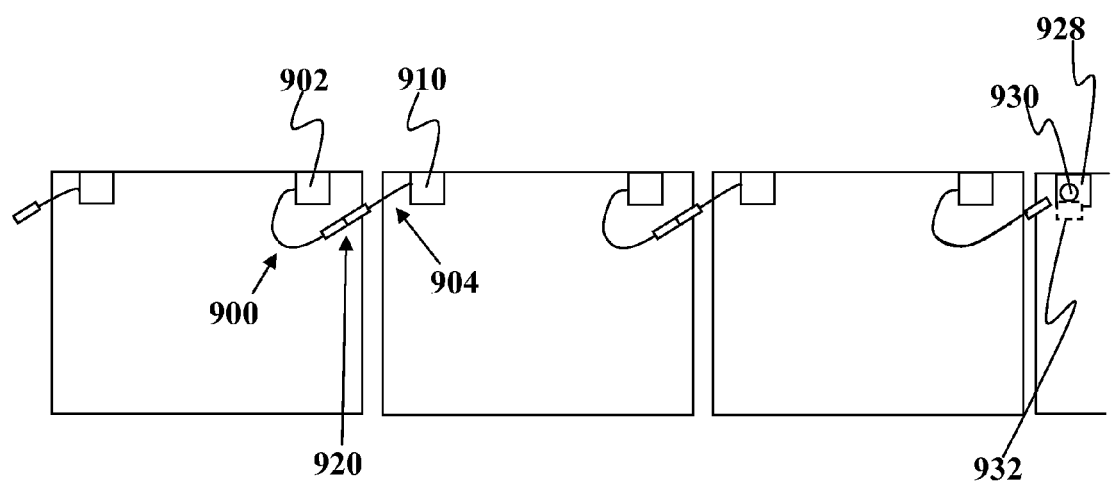
FIG. 31 shows an embodiment of electrical connections between module.

Referring now to FIG. 31, another technique for connecting modules together will now be described. According to this embodiment of the present invention, the wire portion 900 of one housing 902 is of greater length than the wire portion 904 from another housing 910. This provides a "service loop" configuration. Furthermore, as seen in FIG. 31, although not limited to the following, the wires 900 and 904 exiting from the edge housings all exit from the same side of each housing (i.e. in this embodiment, from the left side of each housing). In this manner, there are not two different edge housing parts, but both housing have the cable exiting in the same orientation from the housing. Thus the wires 900 and 904 may be of different lengths, but the housings 902 and 910 are substantially similar. The differing lengths permit for a service loop configuration to accommodate variance in module spacing, protection of connector under panel rather between them (junction 920 is under the module), minimizes cable length, reduces forces on cable, and/or creates a rain drip-off point off-center, rather than where the connector is. The wires 900 and 904 may be permanently connected such as by soldering, welding, or the like. Optionally, the wires 900 and 904 may be coupled by releasable connections, such as but not limited to quick release connections, press-fit connection, plug connections, shaped/keyed connections, or the like.

FIG. 31 also shows that in some embodiments, the edge housing 928 may itself have an opening 930 and/or optionally a laterally oriented receptacle 932 (shown in phantom) to receive a connector at the end of wire 900. In this manner, no wire extends outward from the housing 928. Wire 900 is plugged directly into the housing through either the opening 930, laterally oriented receptacle 932, or some other receiver for the connector 920 of wire 900. Some embodiments of housing 928 may use only a single opening for a single connector 920.

Figure 32:
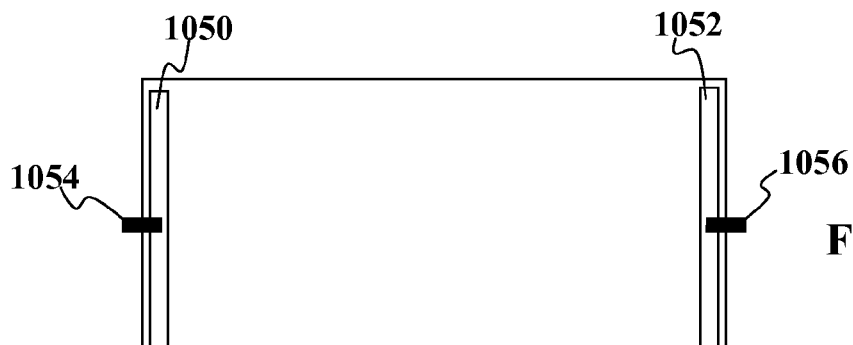
FIGS. 32-35 show various embodiments of internal electrical connections according to various embodiments of the present invention.
Figure 33:
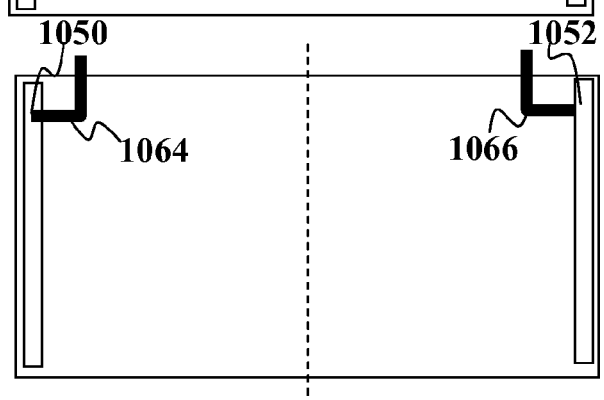
Figure 34:
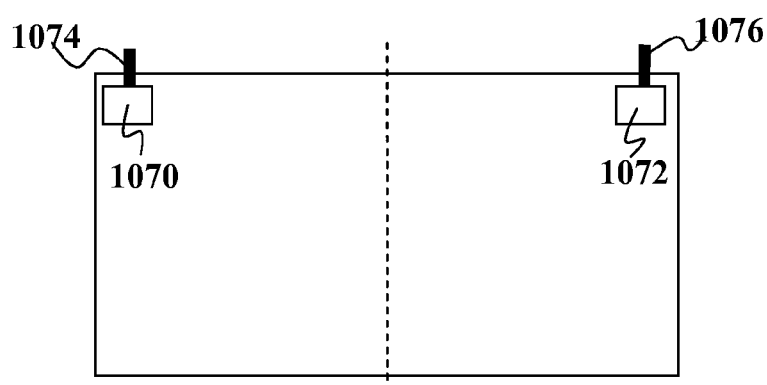
Figure 35:
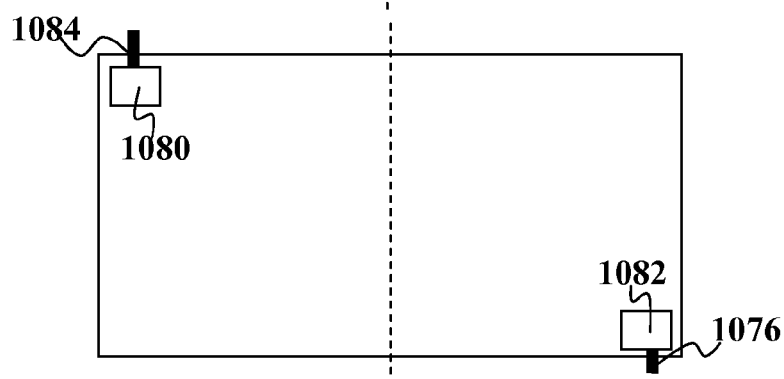

Referring now to FIG. 32 through 35, various embodiments are shown depicting internal electrical wiring from the first and last cell in a module. FIG. 32 shows a first cell 1050 and a last cell 1052. The wires 1054 and 1056 from those cells exit fairly directly, either out the edge or through openings in the module layer. FIG. 33 shows a first cell 1050 and a last cell 1052. The wires 1064 and 1066 from those cells may trace backward under one or more cells before exiting, either out the edge or through openings in the module layer. The wires 1064 and 1066 do not reach within a certain distance from the centerline 1069, which in this embodiment is 10% of the distance from the centerline 1069 to the edge (left or right) of the module. Optionally, they do no reach within 20% of the distance from the centerline 1069 to the edge (left or right) of the module. Optionally, they do no reach within 30% of the distance from the centerline 1069 to the edge (left or right) of the module. Optionally, they do no reach within 40% of the distance from the centerline 1069 to the edge (left or right) of the module. Optionally, they do no reach within 50% of the distance from the centerline 1069 to the edge (left or right) of the module. Optionally, they do no reach within 60% of the distance from the centerline 1069 to the edge (left or right) of the module. Optionally, they do no reach within 70% of the distance from the centerline 1069 to the edge (left or right) of the module. Optionally, they do no reach within 80% of the distance from the centerline 1069 to the edge (left or right) of the module. Optionally, they do no reach within 90% of the distance from the centerline 1069 to the edge (left or right) of the module. FIG. 34 shows a first cell 1070 and a last cell 1072. The wires 1074 and 1076 from those cells exit fairly directly, either out the edge or through openings in the module layer. FIG. 35 shows a first cell 1080 and a last cell 1082. The wires 1084 and 1086 from those cells exit fairly directly, either out the edge or through openings in the module layer.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. By way of nonlimiting example, the backsheet is not limited to rigid modules and may be adapted for use with flexible solar modules and flexible photovoltaic building materials. Embodiments of the present invention may be adapted for use with superstrate or substrate designs. Details of modules with thermally conductive backplanes and heat sinks can be found in commonly assigned, co-pending U.S. patent application Ser. No. 11/465,783 filed Aug. 18, 2006 and fully incorporated herein by reference for all purposes. The pottant material may made more thermally conductive based on techniques shown in U.S. patent application Ser. No. 11/465,783. The use of a conductive foil also provides a module back layer with sufficiently high thermally conductivity to improve heat transfer out of the module. Other backsheet materials may also be used and is not limited to glass only embodiments. The housing of the connector could be made of any material by any method. The connector could be designed for hand assembly instead of automated assembly, leaving out locating features. The connector could be designed without the channel and holes to allow potting. The connector could be designed to allow two or more connectors to exit the solar module, and could include diode linked between the exiting conductors. In one embodiment, both electrical leads or edge connectors are on the same side of module. In another embodiment, they are on different sides. In a still further embodiment, they are diagonal from each other. In yet another embodiment, they are on opposing sides. Optionally, in such a configuration, the top sheet 12 may be a flexible top sheet such as that set forth in U.S. Patent Application Ser. No. 60/806,096 filed Jun. 28, 2006 and fully incorporated herein by reference for all purposes. It should also be understood that embodiments of the present invention may also be used with a central junction box and are not limited to only edge exiting electrical connectors. The modules may be mounted in either landscape or portrait orientation, with edge connectors located as appropriate to minimize distance to the closes adjacent module. It should also be understood that some embodiments of the module may have no pottant layers. Any of the embodiments herein may be adapted for framed and/or frameless modules. They may also be adapted for use with thin-film photovoltaic devices or silicon based photovoltaic devices.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, microcrystalline silicon cell architecture, randomly placed nanorods and/or tetrapods of inorganic materials dispersed in an organic matrix, quantum dot-based cells, or combinations of the above. Many of these types of cells can be fabricated on flexible substrates. Some embodiments may use other transparent frontside module layers other than glass, such as but not limited to polymer material or the like. Some front side module layers may be flexible; some may be rigid. Some alternatives of the present invention may also use traditional central junction boxes as known in the art.

Optionally, the wire or ribbon from edge housing is less than 90% of the distance from an edge of the module to a centerline of the module. Optionally, the wire or ribbon from the edge housing is less than 80% of the distance from the edge housing on the module to a centerline of the module. Optionally, the wire or ribbon from the edge housing is less than 70% of the distance from the edge housing on the module to a centerline of the module. Optionally, the wire or ribbon from the edge housing is less than 60% of the distance from the edge housing on the module to a centerline of the module. Optionally, the wire or ribbon from the edge housing is less than 50% of the distance from the edge housing on the module to a centerline of the module. Optionally, the wire or ribbon from the edge housing is less than 40% of the distance from the edge housing on the module to a centerline of the module.

Optionally, the total length of the wire connection from edge housing to edge housing is about 60 cm or less. Optionally, the total length of the wire connection from edge housing to edge housing is about 50 cm or less. Optionally, the total length of the wire connection from edge housing to edge housing is about 40 cm or less. Optionally, the total length of the wire connection from edge housing to edge housing is about 30 cm or less. Optionally, the total length of the wire connection from edge housing to edge housing is about 20 cm or less. This total length of wire may be comprised of a single wire 900 or from multiple wires used to span the distance. Optionally, the total length of wire from edge housing to edge housing is less than 50 cm for module of an active area of at least 1 $m^2$. Optionally, the total length of wire from edge housing to edge housing is less than 50 cm for module of an active area of at least 2 $m^2$. Any of the above may be associated with a large module of at least 1 $m^2$ active area. This distinguishes from very small solar modules. Optionally, any of the above may be associated with a large module of at least 1.5 $m^2$ active area. Optionally, any of the above may be associated with a large module of at least 2.0 $m^2$ active area.

In another embodiment, the straight line distance of wire connection from an edge housing on one module to the edge housing on an adjacent module (which it is electrically connected) is about 60 cm or less for a module of at least 100 W output at AM1.5G. Optionally, the straight line distance of wire connection from an edge housing on one module to an edge housing on an adjacent module is about 50 cm or less for a module of at least 100 W output at AM1.5G. Optionally, the straight line distance of wire connection from an edge housing on one module to an edge housing on an adjacent module is about 40 cm or less for a module of at least 100 W output at AM1.5G. Optionally, the straight line distance of wire connection from an edge housing on one module to an edge housing on an adjacent module is about 30 cm or less for a module of at least 100 W output at AM1.5G. Optionally, the straight line distance of wire connection from an edge housing on one module to an edge housing on an adjacent module is about 20 cm or less for a module of at least 100 W output at AM1.5G. Optionally, any of the above may be associated with a large module of at least 80 W output at AM1.5G. Optionally, any of the above may be associated with a large module of at least 125 W output at AM1.5G. Optionally, any of the above may be associated with a large module of at least 150 W output at AM1.5G. Optionally, any of the above may be associated with a large module of at least 175 W output at AM1.5G. Optionally, any of the above may be associated with a large module of at least 200 W output at AM1.5G.

Optionally, the length of the wire from edge housing on one module to edge housing on an adjacent module is less than ¼ distance from location of edge housing to the centerline of the module it is on. This may be a vertical or horizontal center line. Optionally, it is to the furthest centerline. Optionally, the length of the wire from edge housing on one module to edge housing on an adjacent module is less than ⅓ distance from location of edge housing to the centerline of the module it is on. Optionally, the length of the wire from edge housing on one module to edge housing on an adjacent module is less than ½ distance from location of edge housing to the centerline of the module it is on. Optionally, any of the above may be associated with a large module of at least 80 W output at AM1.5G. Optionally, any of the above may be associated with a large module of at least 125 W output at AM1.5G. Optionally, any of the above may be associated with a large module of at least 150 W output at AM1.5G. Optionally, any of the above may be associated with a large module of at least 175 W output at AM1.5G. Optionally, any of the above may be associated with a large module of at least 200 W output at AM1.5G. Optionally, instead of length of wire, the distance above the straightline distance from edge housing on one module to closest edge housing on an adjacent module.

Optionally, the location of the connection between wires from edge housings may be asymmetric (one wire longer than other), symmetric (wires same length), or completely on one or the other (no wire from one housing).

Optionally, internal cabling exiting the module does not go under another cell. Optionally, this internal cabling from a first cell or last cell does not go under one other cell. Optionally, this internal cabling exiting the module does not exceed a length of 100 cm. Optionally, this internal cabling exiting the module does not exceed a length of 75 cm. Optionally, this internal cabling exiting the module does not exceed a length of 50 cm. Optionally, this internal cabling exiting the module does not exceed a length of 40 cm. Optionally, this internal cabling exiting the module does not exceed a length of 30 cm. Optionally, this internal cabling exiting the module does not exceed a length of 20 cm. Optionally, internal cabling exiting the module does not exceed a length of ½ the length of the external cabling. Optionally, internal cabling exiting the module does not exceed a length of ⅓ the length of the external cabling.

In some embodiment, the edge housing is fully under the module, extending out over the side, and or with X distance from the edge. This distance X may be 10 cm from the closest edge of the cell it is electrically coupled. Optionally, this distance X may be 20 cm from the closest edge of the cell it is electrically coupled.

The rounded bump is moved away from the staggered edge to allow for flat mounting surface near mounting rails which support the modules. As seen, the rounded bump in the portion 952 is away from the centerline and towards a portion away from the edge of the module to provide space for the mounting rail. Optionally, the portion 952 may or may not have a hole to allow for pottant to be injected in or to allow pottant to flow out.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. By way of example and not limitation, the present U.S. Patent Application Ser. Nos. 60/871,670, 60/891,914, and 60/944,521 are fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic module comprising:
a rigid transparent front layer, an electrically conductive foil back layer, a spacer layer, and a plurality of solar cells arranged to be protected by the front layer and the electrically conductive foil back layer,
wherein the spacer layer comprises a fiber material to maintain a minimum, non electrically conductive spacing between the solar cells and the electrically conductive foil back layer;
wherein the electrically conductive foil back layer is a non-laminate, non-current carrying layer that defines an outward facing back surface and side surface of the module and is wrapped around to cover an edge of the front layer and/or an edge and a portion of the front surface of the front layer to form a fold seal that is continuous over a plurality of surfaces of the transparent front layer such that it regulates transport of water vapor species through a sealed, nonlinear path between the transparent front layer and the back layer.

2. The module of claim 1 wherein the rigid transparent front layer comprises a glass plate.

3. The module of claim 1 wherein the solar cells are positioned between the front layer and the back layer.

4. The module of claim 1 wherein the conductive foil back layer comprises a surface sub-region that is anodized and a bulk sub-region that is substantially non-anodized.

5. The module of claim 1 wherein the electrically conductive foil back layer covering the edge of the front layer provides a moisture barrier to prevent moisture entry between the front layer and the back layer.

6. The module of claim 1 further comprising an adhesive between at least the front layer and the electrically conductive foil back layer covering the edge of the front layer.

7. The module of claim 1 further comprising a butyl rubber adhesive containing silane primer, wherein the adhesive is between at least the front layer and the electrically conductive foil back layer covering the edge of the front layer.

8. A method comprising:
forming a module comprising a rigid transparent front layer, an electrically conductive foil back layer, a spacer layer, and a plurality of solar cells arranged to be protected by the front layer and the electrically conductive foil back layer; wherein the electrically conductive foil back layer is a non-laminate, non-current carrying metal layer that defines an outward facing back surface and side surface of the module, wherein the spacer layer comprises a fiber material to maintain a minimum, non electrically conductive spacing between the solar cells and the electrically conductive foil back layer.

9. A method comprising:
installing a plurality of modules, wherein each of the modules comprises a rigid transparent front layer, an electrically conductive foil back layer, a spacer layer, and a plurality of solar cells arranged to be protected by the front layer and the electrically conductive foil back layer, wherein the electrically conductive foil back layer is a non-laminate, non-current carrying metal layer that defines an outward facing back surface and side surface of the module, wherein the spacer layer comprises a fiber material to maintain a minimum, non electrically conductive spacing between the solar cells and the electrically conductive foil back layer.

10. The method of claim 9 wherein the modules are installed in landscape configuration.

11. A photovoltaic power installation comprising:
a plurality of modules, wherein each of the modules comprises a rigid transparent front layer, an electrically conductive foil back layer, a spacer layer, and a plurality of solar cells arranged to be protected by the front layer and the electrically conductive foil back layer, wherein the electrically conductive foil back layer is a non-laminate, non-current carrying layer that defines an outward facing back surface and side surface of the module, wherein the spacer layer comprises a fiber material to maintain a minimum, non electrically conductive spacing between the solar cells and the electrically conductive foil back layer.

12. The photovoltaic power installation of claim 11 wherein the solar cells are positioned between the front layer and the back layer.

13. The photovoltaic power installation of claim 11 wherein the modules are mounted in landscape configuration.

14. The photovoltaic power installation of claim 11 further comprising a plurality of electrical leads from each of the modules, wherein adjacent modules are coupled together by at least one of the electrical leads extending outward from the modules without passing through a central junction box on the modules to reach an adjacent module.

15. The photovoltaic power installation of claim 14 wherein the electrical leads include connectors each having a length less than about 2× a distance separating adjacent modules, wherein length is measured based on the portion of the connector located outside of the modules.

16. The photovoltaic power installation of claim 11 wherein the modules are coupled in a series interconnection.

17. The photovoltaic power installation of claim 11 wherein the modules are mounted on to support rails and the support rails are mounted to support beams.

18. The photovoltaic power installation of claim 11 wherein the modules are frameless modules.

19. The photovoltaic power installation of claim 11 wherein the modules in one row are electrically coupled in series.

20. The photovoltaic power installation of claim 11 wherein the modules are in one row of the installation and wherein subsets of the modules in the row are coupled in series.

21. The photovoltaic power installation of claim 11 wherein the modules one row of the installation are coupled in series, wherein connections between rows are in parallel.

22. The photovoltaic power installation of claim 11 wherein the modules in one row of the installation are electrically coupled in series, wherein connections between rows are in series.

23. The photovoltaic power installation of claim 11 wherein the modules are frameless and mounted on a plurality of rails, wherein the rails carry electrical charge between modules.

24. The photovoltaic power installation of claim 11 wherein the modules are ground mounted.

25. The photovoltaic power installation of claim 11 wherein the modules are roof mounted.

26. The photovoltaic power installation of claim 11 wherein the modules are roof mounted on low profile, angled mounting brackets coupled to the roof.

* * * * *